(12) United States Patent
Kim

(10) Patent No.: US 11,121,163 B2
(45) Date of Patent: Sep. 14, 2021

(54) IMAGE SENSOR

(71) Applicant: SAMSUNG ELECTRONICS CO., LTD., Suwon-si (KR)

(72) Inventor: Jingyun Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/677,710

(22) Filed: Nov. 8, 2019

(65) Prior Publication Data

US 2020/0279877 A1 Sep. 3, 2020

(30) Foreign Application Priority Data

Feb. 28, 2019 (KR) ........................ 10-2019-0024021

(51) Int. Cl.
*H01L 27/146* (2006.01)

(52) U.S. Cl.
CPC .... *H01L 27/1463* (2013.01); *H01L 27/14616* (2013.01); *H01L 27/14643* (2013.01)

(58) Field of Classification Search
CPC ........... H01L 27/14616; H01L 27/1463; H01L 27/14643
USPC ................................. 257/290, 291, 294, 446
See application file for complete search history.

(56) References Cited

U.S. PATENT DOCUMENTS

| | | | |
|---|---|---|---|
| 7,879,676 B2 | 2/2011 | Lee et al. | |
| 7,977,202 B2 | 7/2011 | Chuang et al. | |
| 8,648,944 B2 * | 2/2014 | Iwata | H01L 27/1463 348/294 |
| 8,941,199 B2 | 1/2015 | Lee et al. | |
| 9,553,119 B2 | 1/2017 | Choi et al. | |
| 9,620,546 B2 | 4/2017 | Chung et al. | |
| 9,786,606 B2 * | 10/2017 | Feilchenfeld | H01L 21/76224 |
| 10,204,950 B1 * | 2/2019 | Yamashita | H01L 27/1464 |
| 2006/0261386 A1 * | 11/2006 | Tanaka | H01L 27/14609 257/292 |
| 2012/0018617 A1 * | 1/2012 | Miyanami | H01L 27/1464 250/208.1 |
| 2019/0051685 A1 * | 2/2019 | Handa | H01L 27/14641 |
| 2019/0131478 A1 * | 5/2019 | Wang | H01L 27/1463 |

(Continued)

FOREIGN PATENT DOCUMENTS

| | | |
|---|---|---|
| CN | 111009535 A | 4/2020 |
| CN | 111146218 A | 5/2020 |

(Continued)

*Primary Examiner* — Matthew E Warren
(74) *Attorney, Agent, or Firm* — Volentine, Whitt & Francos, PLLC

(57) ABSTRACT

An image sensor includes a semiconductor substrate of first conductivity type having first and second surfaces and including pixel regions, photoelectric conversion regions of second conductivity type respectively provided in the pixel regions, and a pixel isolation structure disposed in the semiconductor substrate to define the pixel regions and surrounding each of the photoelectric conversion regions. The pixel isolation structure includes a semiconductor pattern extending from the first surface to the second surface of the semiconductor substrate, a sidewall insulating pattern between a sidewall of the semiconductor pattern and the semiconductor substrate, and a dopant region in at least a portion of the semiconductor pattern.

20 Claims, 22 Drawing Sheets

(56) References Cited

U.S. PATENT DOCUMENTS

2020/0111821 A1 4/2020 Hong et al.
2020/0144316 A1 5/2020 Kim et al.

FOREIGN PATENT DOCUMENTS

KR 1020200040131 A 4/2020
KR 1020200052126 A 5/2020

* cited by examiner

IMAGE SENSOR

CROSS-REFERENCE TO RELATED APPLICATION

This U.S. non-provisional patent application claims priority under 35 U.S.C. § 119 to Korean Patent Application No. 10-2019-0024021 filed on Feb. 28, 2019, the subject matter of which is hereby incorporated by reference.

BACKGROUND

Embodiments of the inventive concept relate to image sensors and, more particularly, to image sensors having improved electrical and/or optical characteristics.

An image sensor converts incident electromagnetic energy (e.g., externally applied light) into a corresponding electrical signal. As computer and communication industries have been developed, the demand for high-performance image sensors has increased, particularly in fields related to digital cameras, camcorders, personal communication systems (PCS), game consoles, security devices, and medical devices.

Image sensors include charge coupled device (CCD) image sensors and complementary metal-oxide-semiconductor (CMOS) image sensors. CMOS image sensors are easily and simply driven. In addition, CMOS image sensors may be realized as a single chip including both signal processing circuitry and image sensing circuitry. Thus, the physical size of many CMOS image sensors, as well as system incorporating CMOS image sensors may be reduced. In this regard, CMOS image sensors are often incorporated into portable or battery-powered devices. Hence, power consumption is an important design consideration.

CMOS image sensors may also be manufactured using well-understood CMOS processing technique, thereby reducing overall manufacturing costs. Furthermore, CMOS image sensors offer high resolution due to recent developments in CMOS processing techniques. Accordingly, the demand for CMOS image sensors should continue in many fields of endeavor.

SUMMARY

Embodiments of the inventive concept provide image sensors having improved electrical and/or optical performance characteristics.

In one aspect, the inventive concept provides an image sensor including a semiconductor substrate of first conductivity type having a first surface and an opposing second surface and including a plurality of pixel regions, photoelectric conversion regions of second conductivity type respectively provided in the pixel regions, and a pixel isolation structure disposed in the semiconductor substrate to define the plurality of pixel regions and surrounding each of the photoelectric conversion regions. The pixel isolation structure may include a semiconductor pattern extending from the first surface to the second surface, a sidewall insulating pattern between a sidewall of the semiconductor pattern and the semiconductor substrate, and a dopant region in at least a portion of the semiconductor pattern.

In another aspect, the inventive concept provides an image sensor including a semiconductor substrate including a pixel array region and a pad region around the pixel array region, the semiconductor substrate having a first surface and a second surface, photoelectric conversion regions provided in the semiconductor substrate in the pixel array region and arranged in first and second directions intersecting each other when viewed in a plan view, a pixel isolation structure extending from the first surface to the second surface and surrounding each of the photoelectric conversion regions in a plan view, the pixel isolation structure including a semiconductor pattern vertically penetrating the semiconductor substrate and including a dopant region doped with dopants, and a sidewall insulating pattern surrounding a sidewall of the semiconductor pattern, and a contact plug connected to the dopant region of the semiconductor pattern in the pad region.

In another aspect, the inventive concept provides an image sensor including a semiconductor substrate of first conductivity type and having a first surface and an opposing second surface, photoelectric conversion regions provided in the semiconductor substrate and two-dimensionally arranged, the photoelectric conversion regions second conductivity type, and a pixel isolation structure extending from the first surface to the second surface of the semiconductor substrate and surrounding each of the photoelectric conversion regions in a plan view. The pixel isolation structure may include a semiconductor pattern vertically penetrating the semiconductor substrate, and a sidewall insulating pattern surrounding a sidewall of the semiconductor pattern. The semiconductor pattern may include an upper region adjacent to the first surface and a lower region adjacent to the second surface, and a dopant concentration in the upper region may be greater than a dopant concentration in the lower region.

BRIEF DESCRIPTION OF THE DRAWINGS

The making and use of the inventive concept may be more fully appreciated upon consideration of the following detailed description together with the accompanying drawings.

DETAILED DESCRIPTION

An image sensor and a method of manufacturing the same according to some embodiments of the inventive concept will be described more fully hereinafter with reference to the accompanying drawings.

Figure 1:
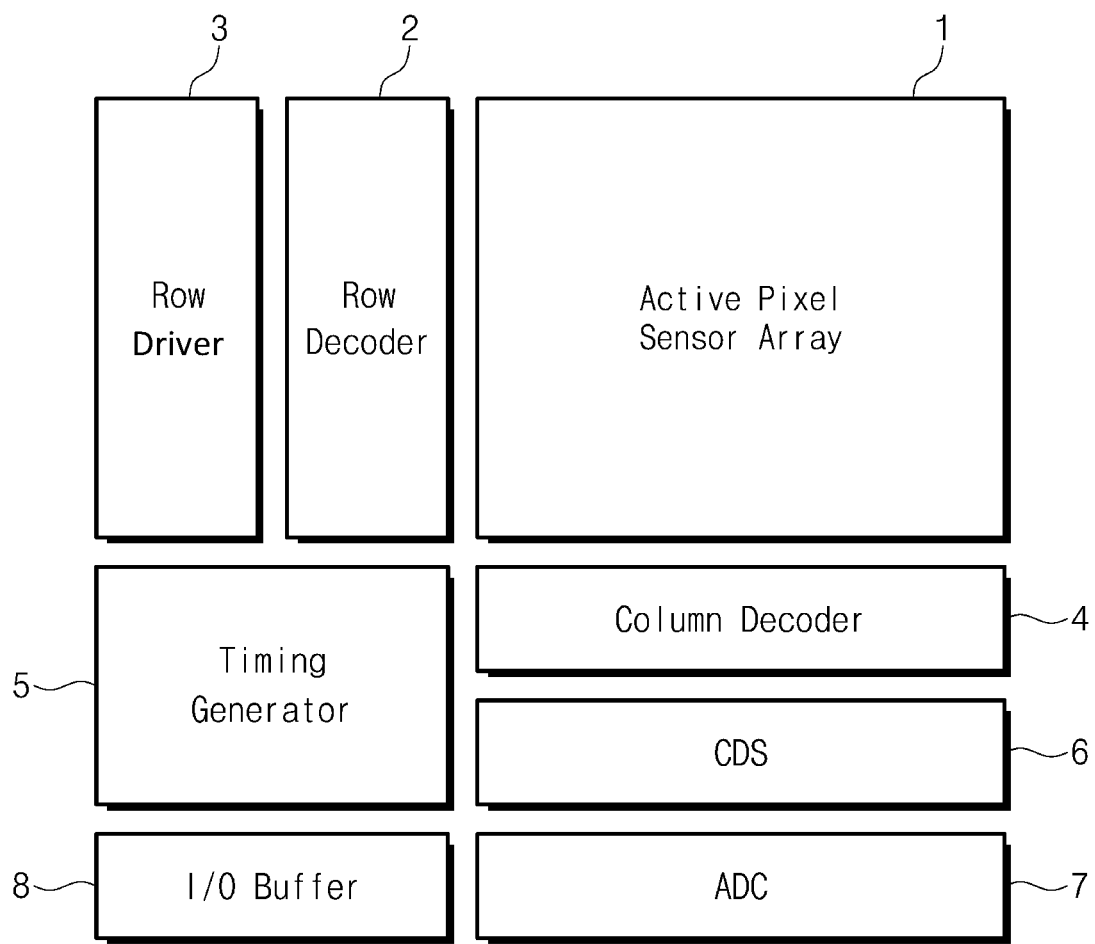
FIG. 1 is a block diagram illustrating an image sensor according to some embodiments of the inventive concept.

Figure (FIG. 1 is a block diagram illustrating an image sensor according to some embodiments of the inventive concept.

Referring to FIG. 1, an image sensor may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of unit pixels two-dimensionally arranged and may convert optical signals into electrical signals. The active pixel sensor array 1 may be driven by a plurality of driving signals (e.g., a pixel selection signal, a reset signal, and a charge transfer signal) provided from the row driver 3. In addition, the converted electrical signals may be provided to the correlated double sampler 6.

The row driver 3 may provide a plurality of driving signals for driving the plurality of unit pixels to the active pixel sensor array 1 in response to signals decoded in the row decoder 2. When the unit pixels are arranged in a matrix form, the driving signals may be provided to each row of the matrix.

The timing generator 5 may provide timing signals and control signals to the row decoder 2 and the column decoder 4.

The correlated double sampler 6 may receive electrical signals generated from the active pixel sensor array 1 and may hold and sample the received electrical signals. The correlated double sampler 6 may doubly sample a specific noise level and a signal level of the electrical signal and may output a difference level corresponding to a difference between the noise level and the signal level.

The analog-to-digital converter 7 may convert an analog signal, which corresponds to the difference level outputted from the correlated double sampler 6, into a digital signal. The analog-to-digital converter 7 may output the digital signal.

The I/O buffer 8 may latch the digital signals and may sequentially output the latched digital signals to an image signal processor (not shown) in response to signals decoded in the column decoder 4.

Figure 2:
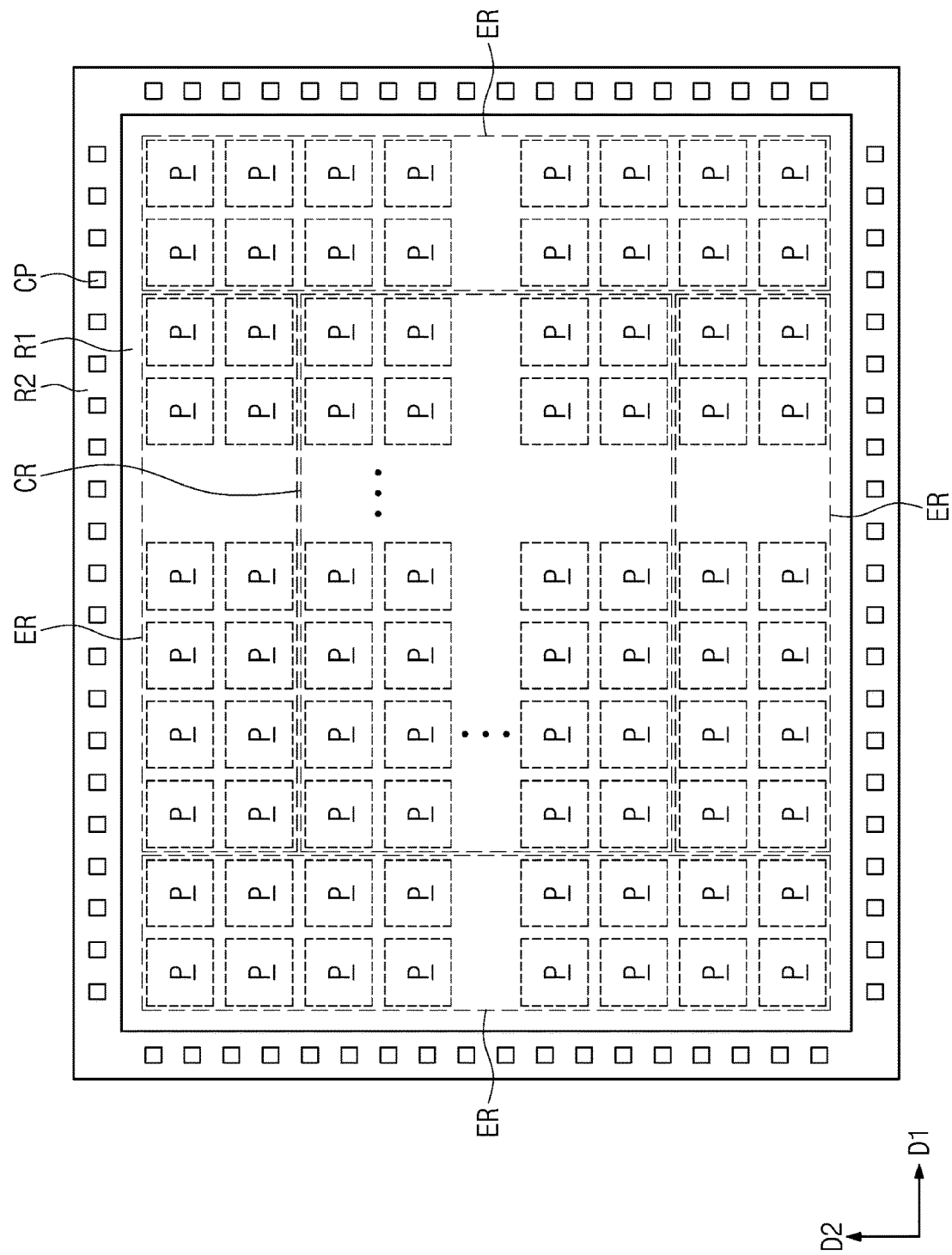
FIG. 2 is a plan view illustrating an image sensor according to some embodiments of the inventive concept.

FIG. 2 is a plan view illustrating an image sensor according to some embodiments of the inventive concept.

Referring to FIG. 2, an image sensor may include a pixel array region R1 and a pad region R2.

A plurality of unit pixels P may be two-dimensionally arranged in first and second directions D1 and D2 intersecting each other in the pixel array region R1. An electrical signal generated in response to incident light may be output from each of the unit pixels P of the pixel array region R1.

The pixel array region R1 may include a central region CR and edge regions ER surrounding the central region CR. That is, the edge regions ER may be disposed at top, bottom, left and right sides of the central region CR when viewed in a plan view.

An angle of the incident light illuminating the edge regions ER of the pixel array region R1 may be different than that of light incident illuminating the central region CR of the pixel array region R1.

A plurality of conductive pads CP used to input/output control signals and photoelectric signals may be disposed in the pad region R2. The pad region R2 may surround the pixel array region R1 in a plan view, and thus the pad region R2 may be easily connected to external devices.

Figure 3A:
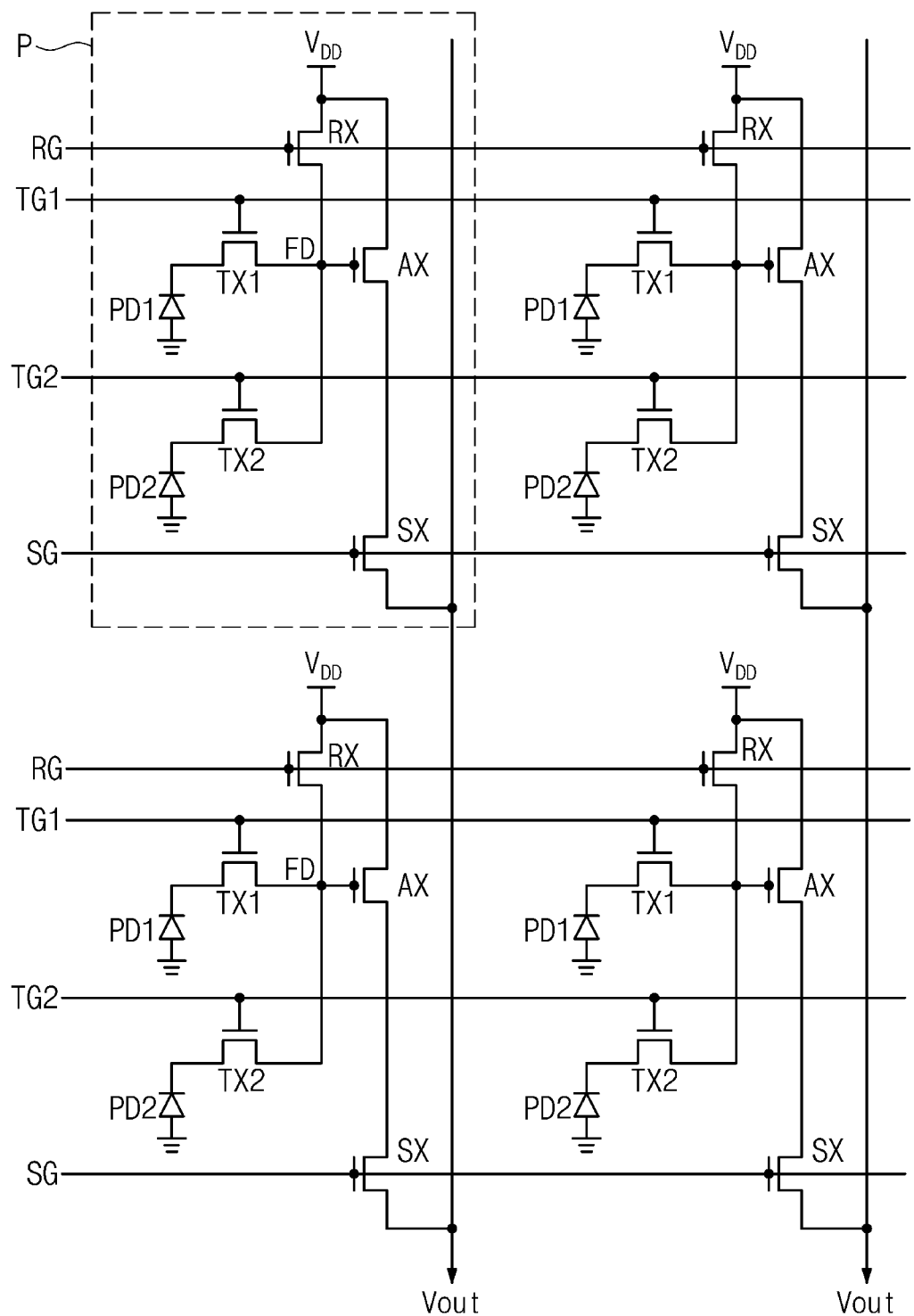
FIGS. 3A and 3B are circuit diagrams illustrating active pixel sensor arrays of image sensors according to some embodiments of the inventive concept.
Figure 3B:
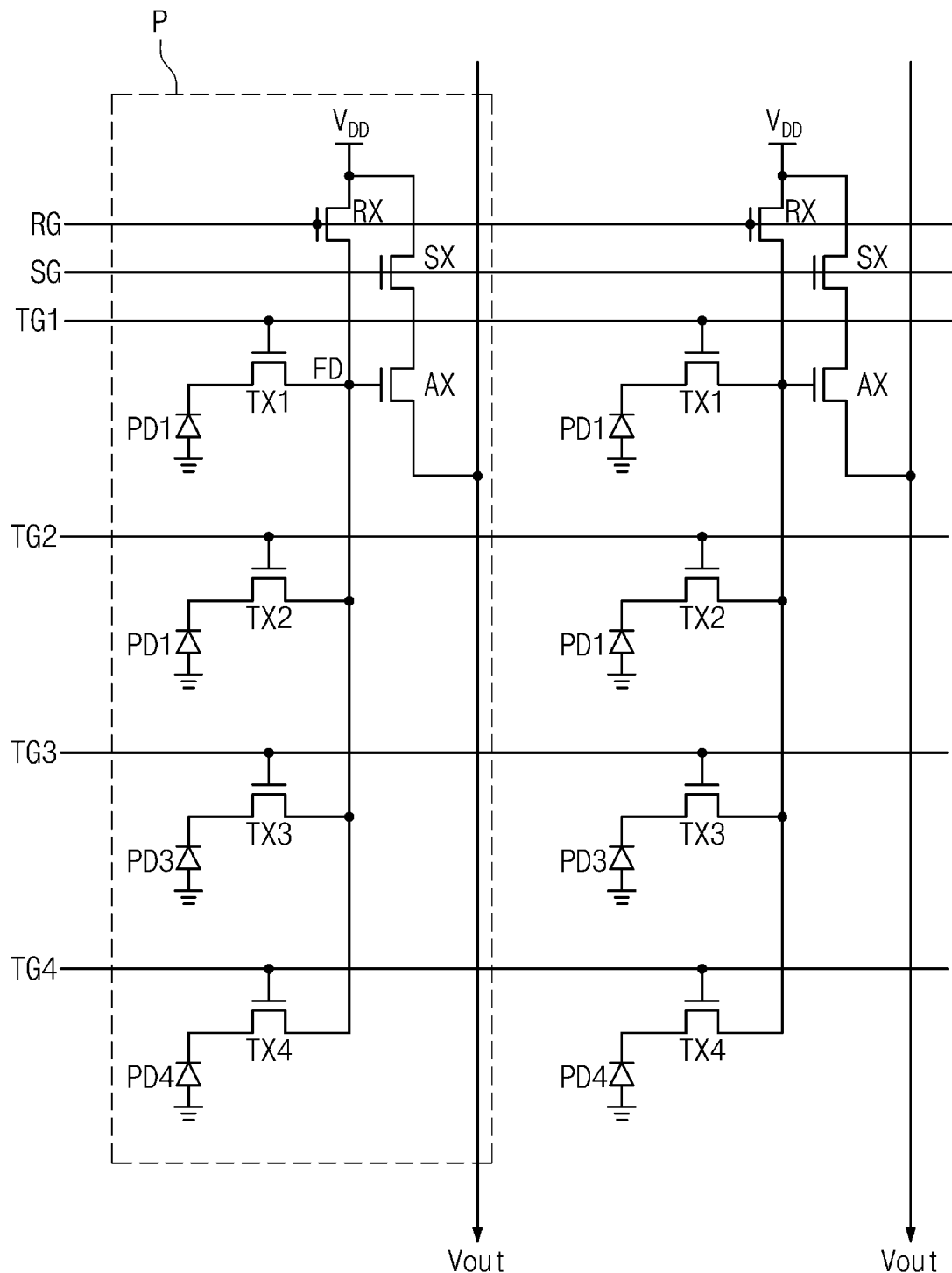

FIGS. 3A and 3B are circuit diagrams illustrating active pixel sensor arrays of image sensors according to some embodiments of the inventive concept.

Referring to FIG. 3A, the active pixel sensor array 1 may include a plurality of unit pixels P. The unit pixels P may be arranged in a matrix including rows columns, wherein a respective unit pixel P may include first and second photoelectric conversion elements PD1 and PD2, first and second transfer transistors TX1 and TX2, and logic transistors RX, SX and AX. Here, the logic transistors RX, SX and AX may include a reset transistor RX, a selection transistor SX, and an amplifying transistor AX. Gate electrodes of the first and second transfer transistors TX1 and TX2, a gate electrode of the reset transistor RX and a gate electrode of the selection transistor SX may be connected to driving signal lines TG1, TG2, RG and SG, respectively.

The first transfer transistor TX1 may include a first transfer gate electrode TG1 and may be connected to the first photoelectric conversion element PD1. The second transfer transistor TX2 may include a second transfer gate electrode TG2 and may be connected to the second photoelectric conversion element PD2. In addition, the first and second transfer transistors TX1 and TX2 may share a charge detection node (i.e., a floating diffusion region) FD.

The first and second photoelectric conversion elements PD1 and PD2 may generate (e.g., accumulate) photocharge (hereafter, "charge") in proportion to the amount of incident light. Each of the first and second photoelectric conversion elements PD1 and PD2 may include a photodiode, a photo transistor, a photo gate, a pinned photodiode (PPD), or any combination thereof.

The first and second transfer gate electrodes TG1 and TG2 may be used to transfer the charge accumulated in the first and second photoelectric conversion elements PD1 and PD2 to the charge detection node (i.e., the floating diffusion region) FD. Complementary signals may be applied to the first and second transfer gate electrodes TG1 and TG2. That is, charge may be transferred from one of the first and second photoelectric conversion elements PD1 and PD2 to the charge detection node FD.

The charge detection node FD may receive the charge generated in the first and second photoelectric conversion elements PD1 and PD2 and may cumulatively store the received charge. The amplifying transistor AX may be controlled according to the amount of the charge accumulated in the charge detection node FD.

The reset transistor RX may be used to periodically reset the charge accumulated in the charge detection node FD. That is, a drain electrode of the reset transistor RX may be connected to the charge detection node FD, and a source electrode of the reset transistor RX may be connected to a power voltage $V_{DD}$. When the reset transistor RX is turned ON, the power voltage $V_{DD}$ connected to the source electrode of the reset transistor RX may be transmitted to the charge detection node FD. Thus, the charge accumulated in the charge detection node FD may be discharged to reset the charge detection node FD when the reset transistor RX is turned ON.

The amplifying transistor AX may be used to amplify a change in potential of the charge detection node FD and may output the amplified or pixel signal to an output line Vout through the selection transistor SX. The amplifying transistor AX may be a source follower buffer amplifier that generates a source-drain current in proportion to the amount of charge provided to a gate electrode thereof. The gate electrode of the amplifying transistor AX may be connected to the charge detection node FD, a drain electrode of the amplifying transistor AX may be connected to the power voltage $V_{DD}$, and a source electrode of the amplifying transistor AX may be connected to a drain electrode of the selection transistor SX.

The selection transistor SX may be used to select a unit pixel P to be sensed in accordance with a defined row unit. For example, when the selection transistor SX is turned ON, the power voltage $V_{DD}$ connected to the drain electrode of the amplifying transistor AX may be transmitted to the drain electrode of the selection transistor SX.

Referring to FIG. 3B, in certain embodiments, the active pixel sensor array 1 may include a plurality of unit pixels P, wherein each of the unit pixels P may include four transfer transistors TX1, TX2, TX3 and TX4. The four transfer transistors TX1, TX2, TX3 and TX4 may share the charge detection node FD and the logic transistors RX, SX and AX.

In the embodiments illustrated in FIGS. 3A and 3B, a unit pixel P to be sensed in the row unit according to a selection signal. Charge may be transferred from one of the first to fourth photoelectric conversion elements PD1, PD2, PD3 and PD4 to the charge detection node FD in response to signals applied to first to fourth transfer gate electrodes TG1, TG2, TG3 and TG4.

Figure 4:
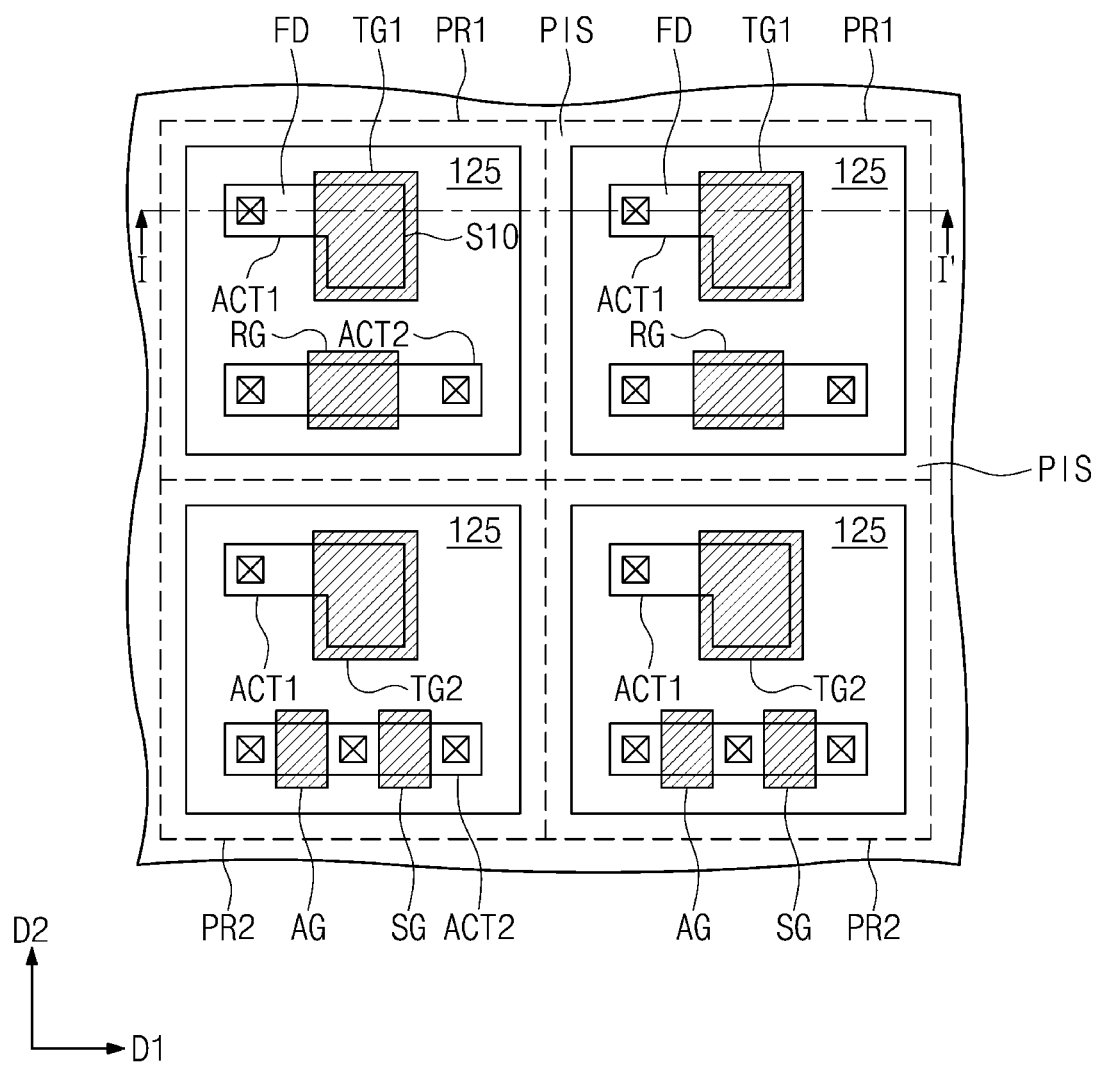
FIG. 4 is a plan view illustrating an image sensor according to some embodiments of the inventive concept.
Figure 5:
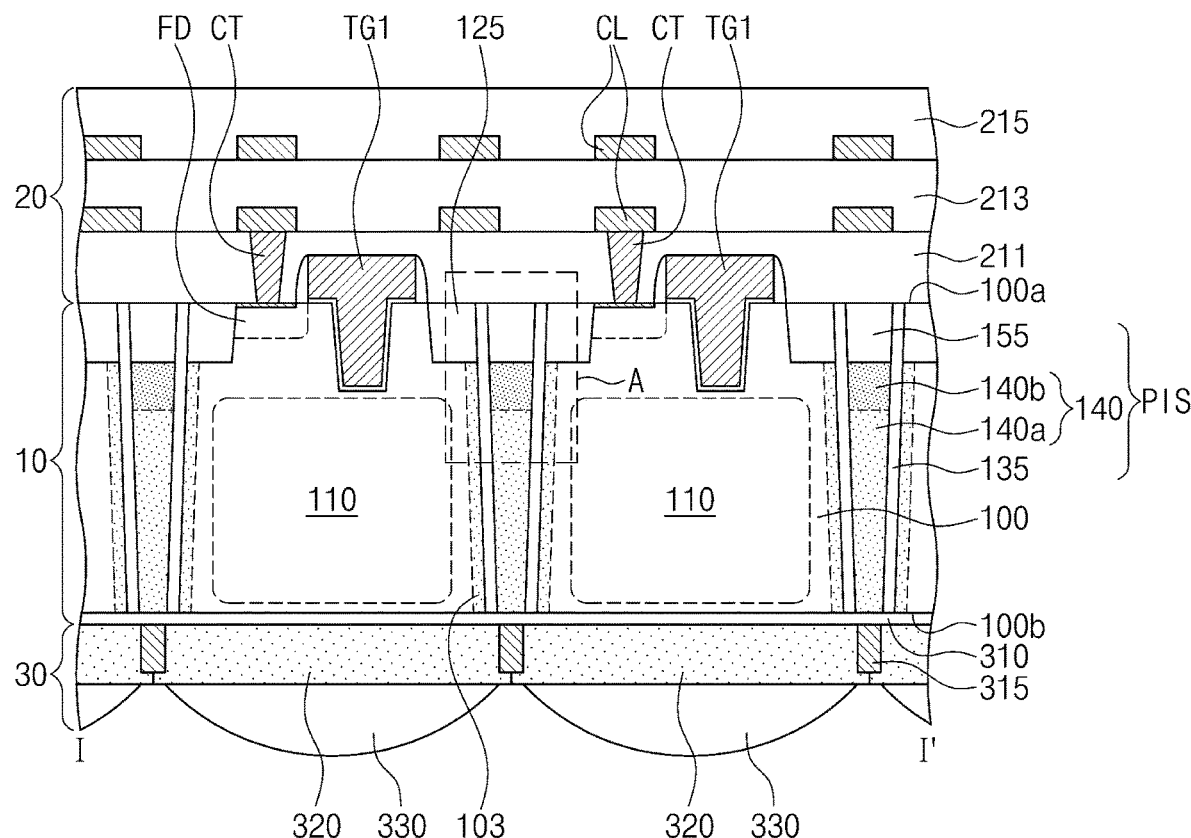
FIG. 5 is a cross-sectional view taken along a line I-I' of FIG. 4 to illustrate an image sensor according to some embodiments of the inventive concept.
Figure 6:
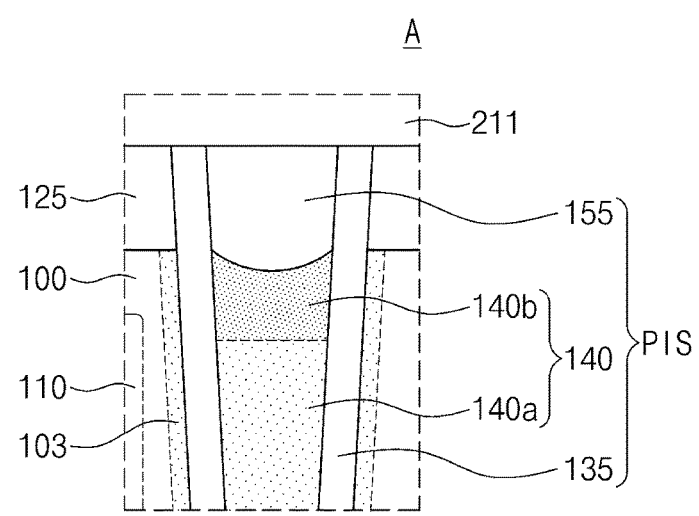
FIG. 6 is an enlarged view of a portion 'A' of FIG. 5.
Figure 7:
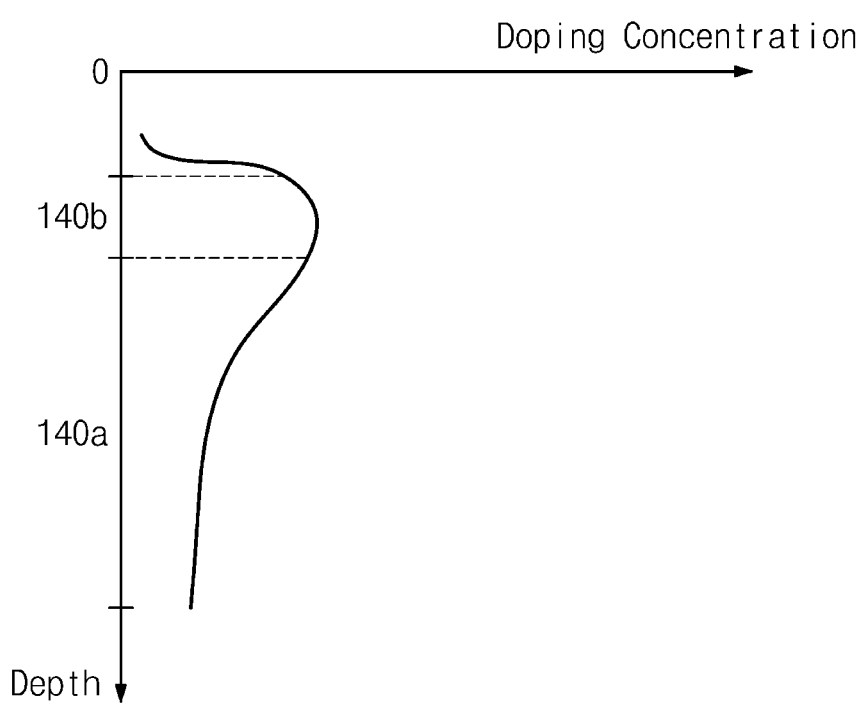
FIG. 7 is a graph showing a doping profile in a pixel isolation structure of an image sensor according to some embodiments of the inventive concept.

FIG. 4 is a plan view illustrating an image sensor according to some embodiments of the inventive concept. FIG. 5 is a cross-sectional view taken along a line I-I' of FIG. 4 and further illustrating an image sensor according to some embodiments of the inventive concept. FIG. 6 is an enlarged view of a portion 'A' of FIG. 5. FIG. 7 is a graph showing a doping profile in a pixel isolation structure of an image sensor according to some embodiments of the inventive concept.

Referring to FIGS. 4 and 5, an image sensor according to some embodiments of the inventive concept may include a photoelectric conversion layer 10, a readout circuit layer 20, and a light transmitting layer 30. The photoelectric conversion layer 10 may be disposed between the readout circuit layer 20 and the light transmitting layer 30 when viewed in a vertical view.

The photoelectric conversion layer 10 may include a semiconductor substrate 100, a pixel isolation structure PIS defining first and second pixel regions PR1 and PR2, and photoelectric conversion regions 110 provided in the first and second pixel regions PR1 and PR2. Incident light may be converted into corresponding electrical signals in the photoelectric conversion regions 110.

The readout circuit layer 20 may include readout circuits (e.g., MOS transistors) connected to the photoelectric conversion layer 10. Electrical signals converted in the photoelectric conversion layer 10 may be processed in the readout circuit layer 20.

The light transmitting layer 30 may include micro lenses 330 arranged in a matrix and including color filters 320 disposed between the semiconductor substrate 100 and the micro lenses 330. The color filters 320 may include red, green and blue color filters. In certain embodiments, some of the color filters 320 may include an infrared filter.

The semiconductor substrate 100 may have a first surface (e.g., a front surface) 100a and an opposing (or opposite facing) second surface (e.g., a back surface) 100b. The semiconductor substrate 100 may be a substrate in which an epitaxial layer having a first conductivity type (e.g., a P-type) is formed on a bulk silicon substrate having the first conductivity type. In some embodiments, the semiconductor substrate 100 may be the P-type epitaxial layer that remains following the removal of a majority thickness of a bulk silicon substrate. Alternatively, the semiconductor substrate 100 may be a bulk semiconductor substrate including a well having the first conductivity type.

The semiconductor substrate 100 may include the pixel isolation structure PIS extending from the first surface 100a to the second surface 100b. The pixel isolation structure PIS may define the first and second pixel regions PR1 and PR2. Here, the pixel isolation structure PIS may include first portions extending in parallel to each other in a first direction D1, and second portions extending in parallel to each other in a second direction D2 to intersect the first portions. The pixel isolation structure PIS may surround each of the first and second pixel regions PR1 and PR2 when viewed in a plan view. A plurality of the first pixel regions PR1 may be arranged in the first direction D1, and a plurality of the second pixel regions PR2 may be arranged in the first direction D1. In addition, the first and second pixel regions PR1 and PR2 may be alternately arranged in the second direction D2.

Referring to FIG. 6, the pixel isolation structure PIS may include a semiconductor pattern 140 vertically penetrating the semiconductor substrate 100, and a sidewall insulating pattern 135 between a sidewall of the semiconductor pattern 140 and the semiconductor substrate 100. Here, the semiconductor pattern 140 may include an undoped lower region 140a and an upper dopant region 140b doped with dopants. The upper dopant region 140b may be adjacent to the first surface 100a of the semiconductor substrate 100. The dopants of the upper dopant region 140b may include at least one of, for example, boron (B), phosphorus (P), arsenic (As), gallium (Ga), indium (In), antimony (Sb), or aluminum (Al).

In addition, the pixel isolation structure PIS may further include a filling insulation pattern 155 on the upper dopant region 140b. A top surface of the filling insulation pattern 155 may be located at substantially the same level as a top surface of a device isolation layer 125. A bottom surface of the filling insulation pattern 155 may be located at substantially the same level as or a lower level than a bottom surface of the device isolation layer 125. The bottom surface of the filling insulation pattern 155 may have a rounded shape.

Referring to FIG. 7, a dopant concentration in the upper dopant region 140b may be greater than a dopant concentration in the lower region 140a of the semiconductor pattern 140. A dopant concentration in the semiconductor pattern 140 may become less from the first surface 100a toward the second surface 100b.

Referring again to FIGS. 4 and 5, a barrier region 103 including dopants of the first conductivity type may be provided on a sidewall of the pixel isolation structure PIS. The barrier region 103 may include the dopants of the same conductivity type (e.g., the P-type) as the semiconductor substrate 100. A concentration of the dopants in the barrier region 103 may be higher than a concentration of the dopants in the semiconductor substrate 100. The barrier region 103 may reduce a dark current which may occur by electron-hole pairs (EHPs) generated by surface defects of a deep trench formed by patterning the semiconductor substrate 100.

In some embodiments, the semiconductor pattern 140 may have a single body provided in an entire portion of the pixel array region R1 described with reference to FIG. 2. In pad region R2 (see FIG. 2), contact plugs may be connected to the upper dopant region 140b of the semiconductor pattern 140. In pad region R2 (see FIG. 2), a negative bias may be applied to the upper dopant region 140b of the semiconductor pattern 140 through a conductive line and the contact plugs. Thus, it is possible to reduce a dark current occurring at a boundary between the pixel isolation structure PIS and the semiconductor substrate 100.

In some embodiments, since the bias is applied through the upper dopant region 140b of the semiconductor pattern 140, delay of a signal transferred from the pad region R2 of FIG. 2 to the central region CR of FIG. 2 may be reduced when the bias is applied to the semiconductor pattern 140. Thus, it is possible to reduce a difference in dark current characteristic between the central region CR of FIG. 2 and the edge regions ER of FIG. 2 of the pixel array region R1.

The photoelectric conversion regions 110 may be provided in the semiconductor substrate 100 of the first and second pixel regions PR1 and PR2, respectively. The photoelectric conversion regions 110 may generate charge in proportion to an intensity of the incident light. The photoelectric conversion regions 110 may be formed by ion-implanting dopants of second conductivity type into the semiconductor substrate 100. The second conductivity type may be opposite to the first conductivity type of the semiconductor substrate 100. Photodiodes may be formed by junction of the semiconductor substrate 100 having the first conductivity type and the photoelectric conversion regions 110 having the second conductivity type.

In some embodiments, a dopant concentration of a region of the photoelectric conversion region 110 adjacent to the first surface 100a may be different than a dopant concentration of another region of the photoelectric conversion region 110 adjacent to the second surface 100b, and thus the photoelectric conversion region 110 may have a potential gradient between the first surface 100a and the second surface 100b of the semiconductor substrate 100. For example, each of the photoelectric conversion regions 110 may include a plurality of vertically-stacked dopant regions.

The device isolation layer 125 may be disposed adjacent to the first surface 100a of the semiconductor substrate 100 in each of the first and second pixel regions PR1 and PR2. The device isolation layer 125 may define first and second active portions ACT1 and ACT2 in the semiconductor substrate 100. The first and second active portions ACT1 and ACT2 may be spaced apart from one another in each of the first and second pixel regions PR1 and PR2 and may have different sizes.

The readout circuit layer 20 may be disposed on the first surface 100a of the semiconductor substrate 100. The readout circuit layer 20 may include the readout circuitry (e.g., MOS transistors) electrically connected to the photoelectric conversion regions 110. That is, the readout circuit layer 20 may include the reset transistor RX, selection transistor SX, and amplifying transistor AX described above with reference to FIGS. 3A and 3B. In addition, the readout circuit layer 20 may include connection lines CL and contact plugs CT which are electrically connected to the MOS transistors.

A first transfer gate electrode TG1 may be disposed on the first active portion ACT1 of the first pixel region PR1, and a second transfer gate electrode TG2 may be disposed on the first active portion ACT1 of the second pixel region PR2.

The first and second transfer gate electrodes TG1 and TG2 may be located in central portions of the first and second pixel regions PR1 and PR2, respectively, when viewed in a plan view. Each of the first and second transfer gate electrodes TG1 and TG2 may include a lower portion inserted in the semiconductor substrate 100 and an upper portion connected to the lower portion. The upper portion of each of the first and second transfer gate electrodes TG1 and TG2 may protrude upward from the first surface 100a of the semiconductor substrate 100. The lower portions of the first and second transfer gate electrodes TG1 and TG2 may penetrate a portion of the semiconductor substrate 100. That is, bottom surfaces of the first and second transfer gate electrodes TG1 and TG2 may be located at a lower level than the first surface 100a of the semiconductor substrate 100. A gate insulating layer may be disposed between the semiconductor substrate 100 and each of the first and second transfer gate electrodes TG1 and TG2.

A floating diffusion region FD may be provided in the semiconductor substrate 100 (i.e., the first active portion ACT1) at a side of each of the first and second transfer gate electrodes TG1 and TG2. The floating diffusion regions FD may be dopant regions having a conductivity type opposite to that of the semiconductor substrate 100. For example, the floating diffusion regions FD may be N-type dopant regions.

In some embodiments, a reset gate electrode RG may be disposed on the second active portion ACT2 of the first pixel region PR1, and an amplifying gate electrode AG and a selection gate electrode SG may be disposed on the second active portion ACT2 of the second pixel region PR2.

The reset gate electrode RG, amplifying gate electrode AG and selection gate electrode SG may be disposed on the semiconductor substrate 100 with the gate insulating layer interposed therebetween. Source/drain dopant regions may be provided in the semiconductor substrate 100 (i.e., the second active portion ACT2) at both sides of each of the reset, amplifying and selection gate electrodes RG, AG and SG.

Interlayer insulating layers 211, 213 and 215 may be stacked on the first surface 100a of the semiconductor substrate 100. The interlayer insulating layers 211, 213 and 215 may cover the MOS transistors of the readout circuits and the first and second transfer gate electrodes TG1 and TG2. For example, each of the interlayer insulating layers 211, 213 and 215 may include at least one of silicon oxide, silicon nitride, or silicon oxynitride. The connection lines CL may be disposed on each of the interlayer insulating layers 211, 213 and 215 and may be electrically connected to the readout circuits through the contact plugs CT.

A plurality of the contact plugs CT may be disposed in the interlayer insulating layers 211, 213 and 215. The contact plugs CT may be connected to the floating diffusion regions FD, the source/drain dopant regions, and/or the reset, amplifying and selection gate electrodes RG, AG and SG.

Each of the contact plugs CT and the connection lines CL may include a barrier metal layer and a metal layer. For example, the barrier metal layer may be formed of a metal nitride such as titanium nitride, tantalum nitride, tungsten nitride, hafnium nitride, and/or zirconium nitride. The metal layer may be formed of at least one of tungsten, copper, hafnium, zirconium, titanium, tantalum, aluminum, ruthenium, palladium, platinum, cobalt, nickel, or any conductive metal nitride thereof. In addition, in some embodiments, a silicide layer may be formed between the contact plug CT and the dopant region connected thereto.

The light transmitting layer 30 may be disposed on the second surface 100b of the semiconductor substrate 100. The light transmitting layer 30 may include a buffer insulating layer 310, the color filters 320 and micro lenses 330.

The buffer insulating layer 310 may cover the second surface 100b of the semiconductor substrate 100. For example, the buffer insulating layer 310 may be disposed in direct contact with the semiconductor pattern 140 of the pixel isolation structure PIS. The buffer insulating layer 310 may be formed of an insulating material having a different refractive index than that of the semiconductor substrate 100. For example, the buffer insulating layer 310 may be formed of an insulating material having a refractive index, less than that of silicon (e.g., a refractive index of about 1.4 to about 4.0). The buffer insulating layer 310 may be formed of $Al_2O_3$, $CeF_3$, $HfO_2$, ITO, MgO, $Ta_2O_5$, $TiO_2$, $ZrO_2$, Si, Ge, ZnSe, ZnS, and/or $PbF_2$, for example. Alternatively, the buffer insulating layer 310 may be formed of an organic material having a high refractive index, for example, a siloxane resin, benzocyclobutene (BCB), a polyimide-based material, an acrylic-based material, parylene C, poly(methyl methacrylate) (PMMA), and/or polyethylene terephthalate (PET). In certain embodiments, the buffer insulating layer 310 may be formed of, for example, strontium titanate ($SrTiO_3$), polycarbonate, glass, bromine, sapphire, cubic zirconia, potassium Niobate ($KNbO_3$), moissanite (SiC), gallium(III) phosphide (GaP), and/or gallium(III) arsenide (GaAs).

The color filters 320 and the micro lenses 330 may be formed to correspond to the first and second pixel regions PR1 and PR2, respectively. Each of the color filters 320 may include a red, green or blue color filter, depending on a corresponding unit pixel. Each of the micro lenses 330 may have a convex shape and may have a specific radius of curvature. Each of the micro lenses 330 may concentrate incident light on each of the first and second pixel regions PR1 and PR2.

A grid pattern 315 may be disposed between the color filters 320. Like the pixel isolation structure PIS, the grid pattern 315 may have a grid shape when viewed in a plan view. For example, the grid pattern 315 may be formed of a metal material such as tungsten or aluminum.

The micro lenses 330 may be two-dimensionally arranged in the first and second directions D1 and D2 intersecting each other. Each of the micro lenses 330 may have an upwardly convex shape and may have a specific radius of curvature. The micro lenses 330 may change a path of light incident on the image sensor to concentrate light. The micro lenses 330 may be formed of a light transmitting resin.

In certain embodiments of the inventive concept describe hereafter, like or similar components will be indicated using like reference numerals and/or designators. Only material differences between respective embodiments will be described in detail.

Figure 8:
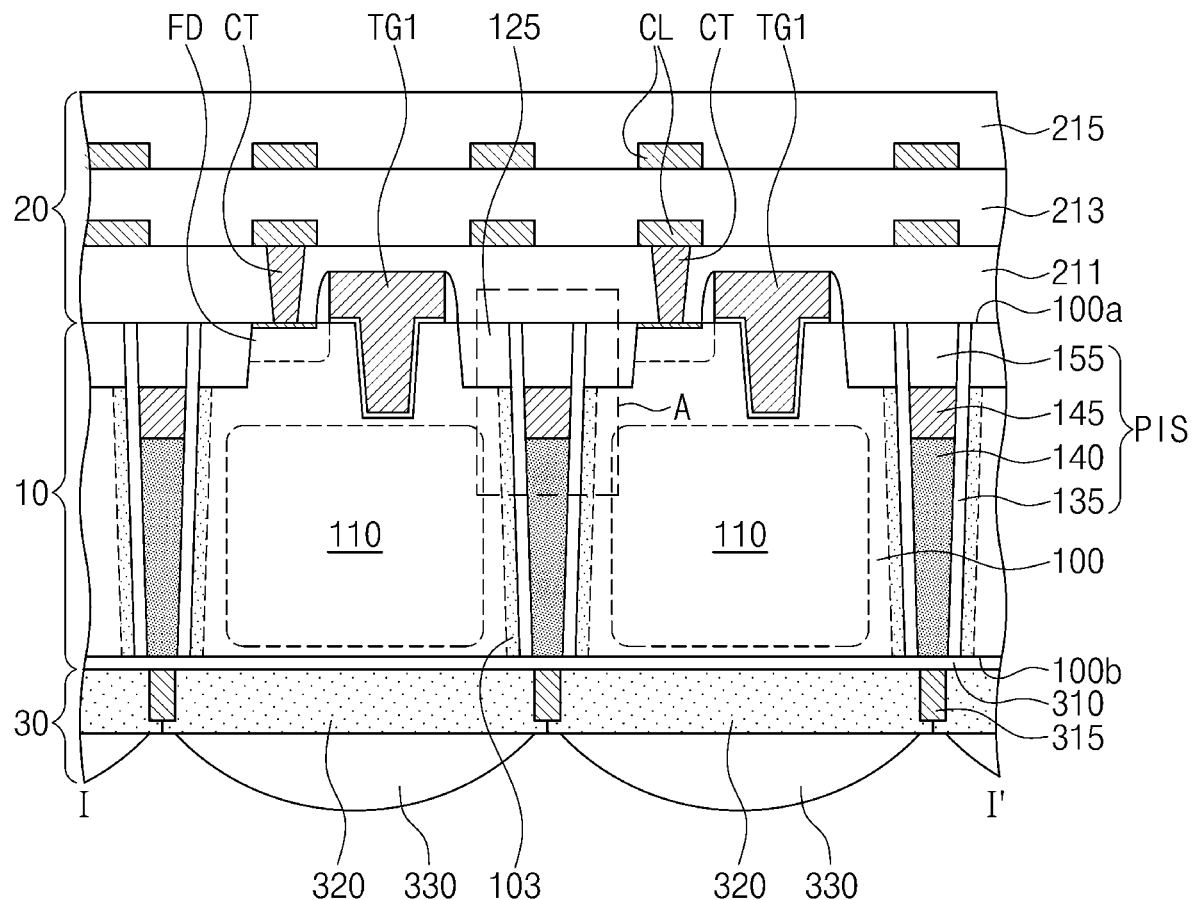
FIG. 8 is a cross-sectional view taken along the line I-I' of FIG. 4 to illustrate an image sensor according to some embodiments of the inventive concept.
Figure 9:
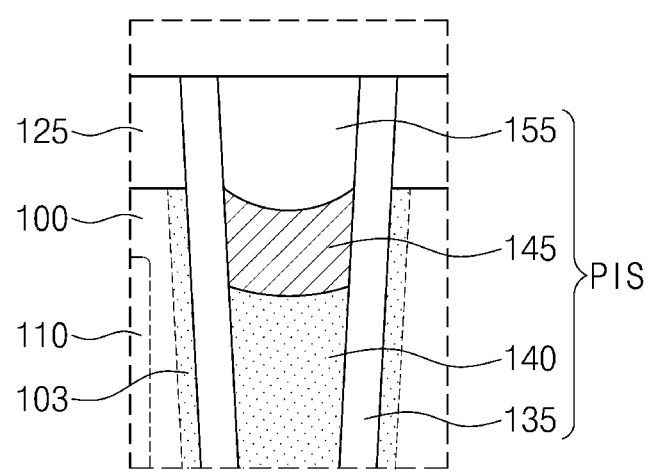
FIG. 9 is an enlarged view of a portion 'A' of FIG. 8.

FIG. 8 is a cross-sectional view taken along the line I-I' of FIG. 4 and further illustrates an image sensor according to some embodiments of the inventive concept. FIG. 9 is an enlarged view of a portion 'A' of FIG. 8.

Referring to FIGS. 4, 8 and 9, a pixel isolation structure PIS defining the first and second pixel regions PR1 and PR2 may include the sidewall insulating pattern 135, a lower semiconductor pattern 140 not doped with dopants, an upper semiconductor pattern 145 doped with dopants, and the filling insulation pattern 155. An interface may exist between the upper semiconductor pattern 145 and the lower semiconductor pattern 140 in the pixel isolation structure PIS. For example, the lower semiconductor pattern 140 may be formed of an undoped poly-silicon layer, and the upper semiconductor pattern 145 may be formed of a poly-silicon layer doped with dopants.

A bottom surface of the upper semiconductor pattern 145 may be located at a lower level than the bottom surface of the device isolation layer 125, and a sidewall of the upper semiconductor pattern 145 may be adjacent to the barrier region 103.

In some embodiments, contact plugs and conductive lines may be connected to the upper semiconductor pattern 145 of the pixel isolation structure PIS in the pad region R2 (see FIG. 2).

Figure 10:
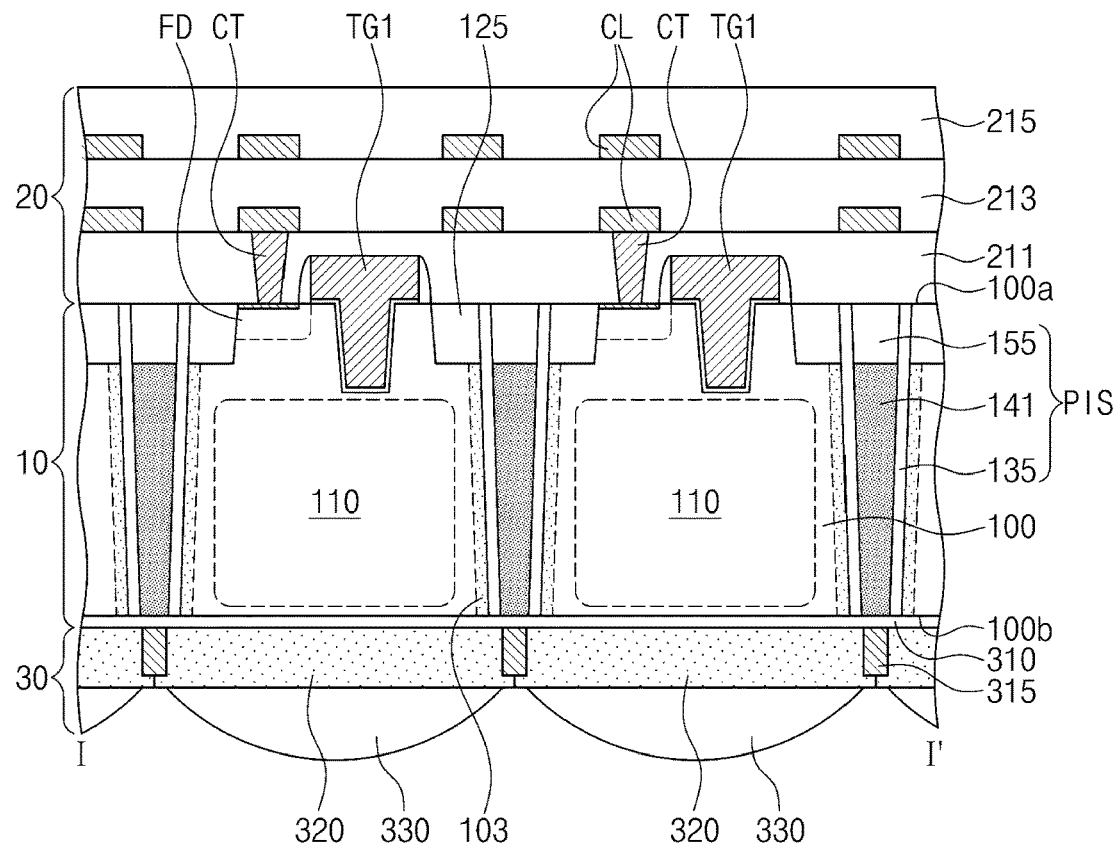
FIG. 10 is a cross-sectional view taken along the line I-I' of FIG. 4 to illustrate an image sensor according to some embodiments of the inventive concept.
Figure 11:
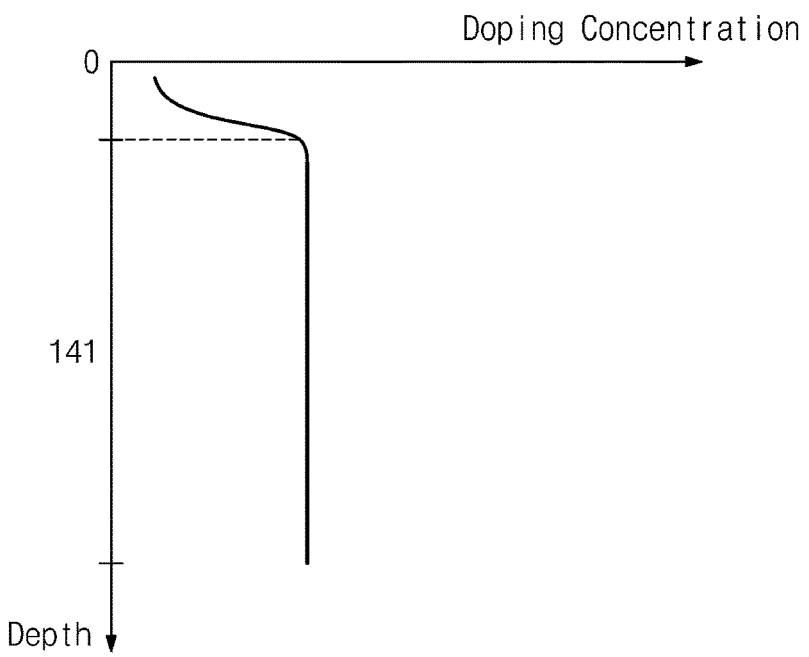
FIG. 11 is a graph showing a doping profile in a pixel isolation structure of an image sensor according to some embodiments of the inventive concept.

FIG. 10 is a cross-sectional view taken along the line I-I' of FIG. 4 and further illustrates an image sensor according to some embodiments of the inventive concept. FIG. 11 is a graph showing a doping profile in a pixel isolation structure of an image sensor according to some embodiments of the inventive concept.

Referring to FIGS. 10 and 11, a pixel isolation structure PIS may include the sidewall insulating pattern 135, a semiconductor pattern 141 doped with dopants, and the filling insulation pattern 155.

The semiconductor pattern 141 doped with dopants may include a poly-silicon layer and may include dopants such as boron (B), phosphorus (P), arsenic (As), gallium (Ga), indium (In), antimony (Sb), or aluminum (Al).

A concentration of the dopants in an upper region of the semiconductor pattern 141 adjacent to the first surface 100a of the semiconductor substrate 100 may be substantially equal to a concentration of the dopants in a lower region of the semiconductor pattern 141 adjacent to the second surface 100b of the semiconductor substrate 100. That is, the semiconductor pattern 141 may have a substantially uniform dopant concentration.

Figure 12:
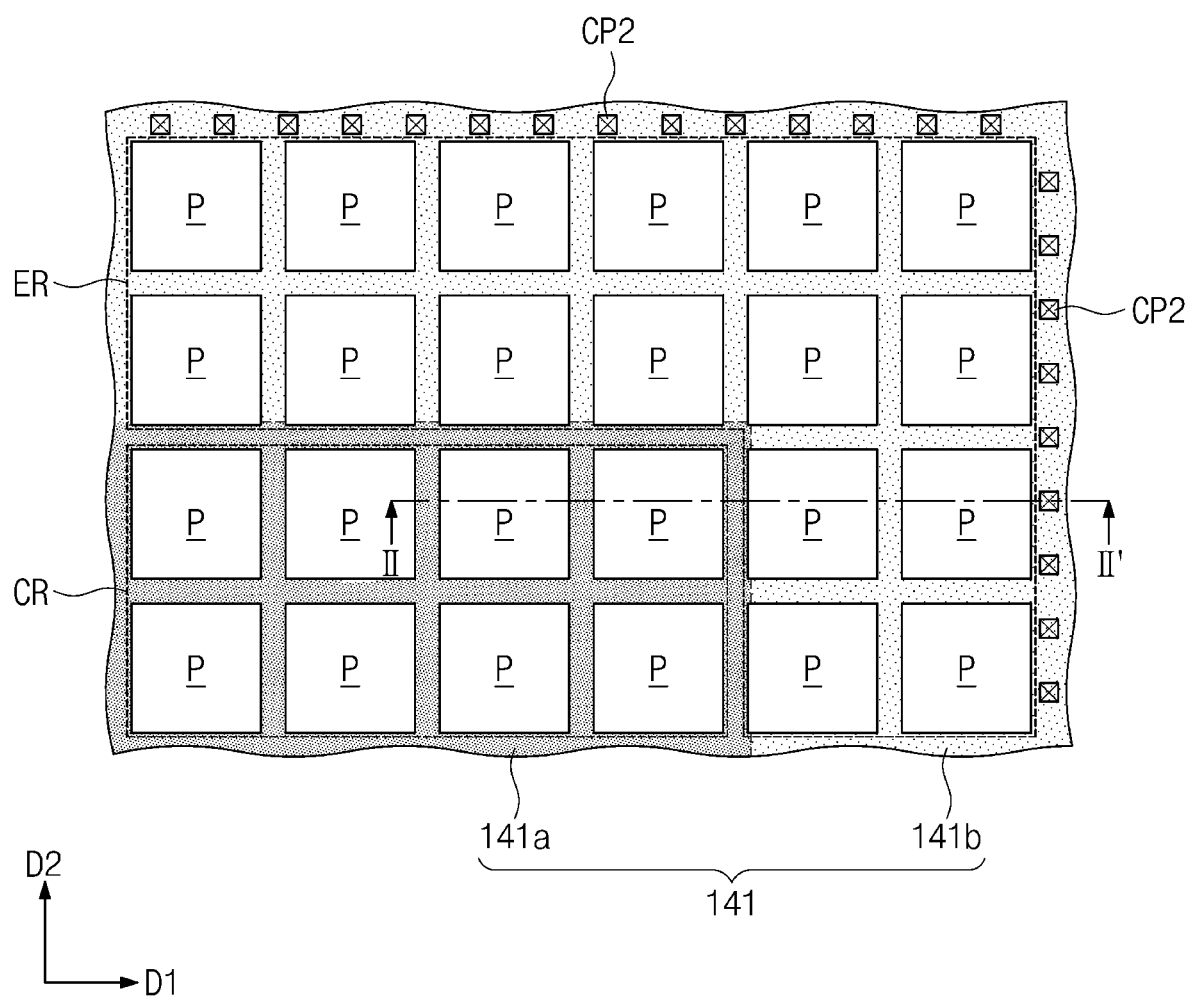
FIG. 12 is a plan view illustrating a portion of an image sensor according to some embodiments of the inventive concept.
Figure 13:
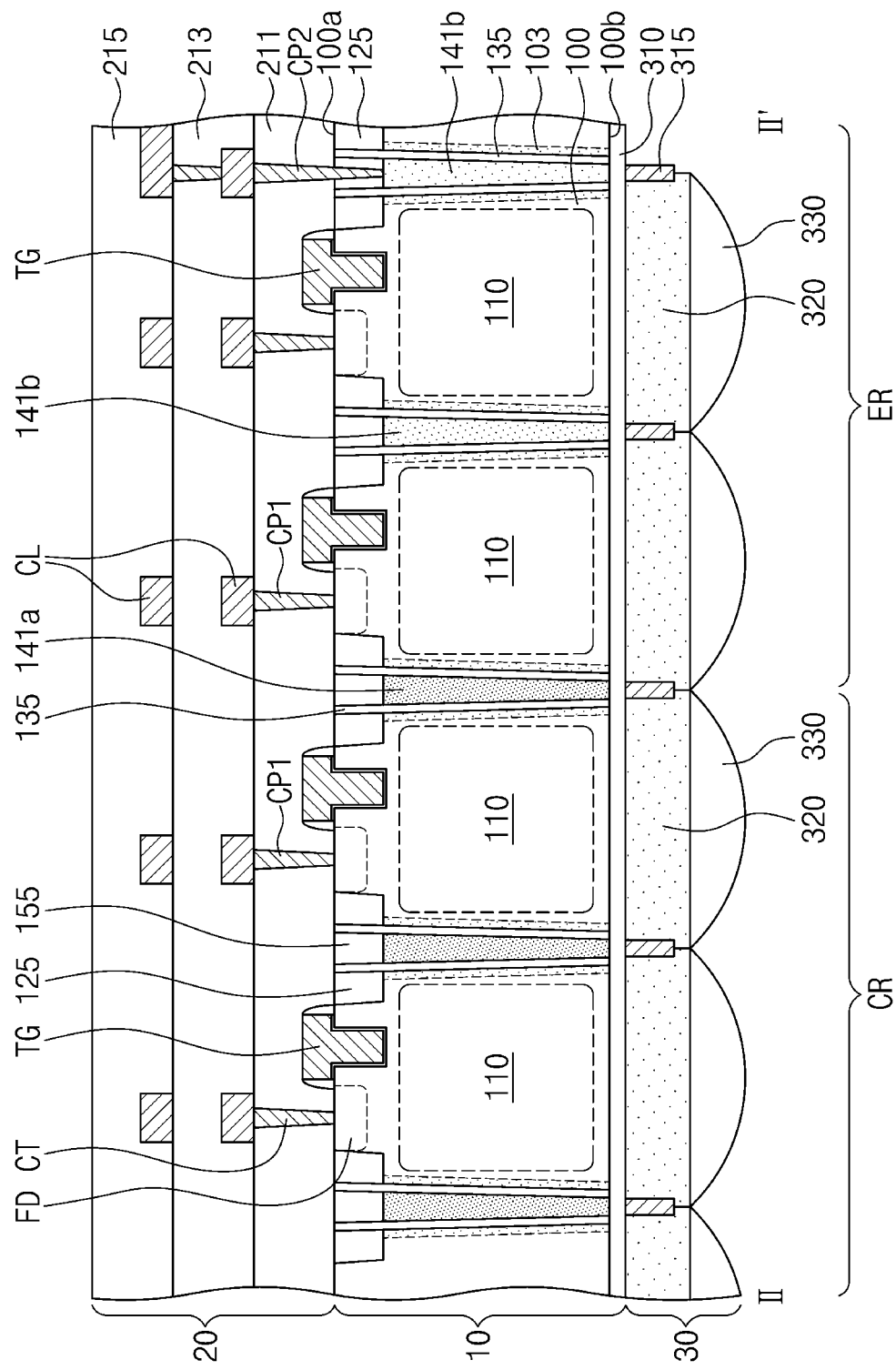
FIG. 13 is a cross-sectional view taken along a line II-II' of FIG. 12 to illustrate an image sensor according to some embodiments of the inventive concept.

FIG. 12 is a plan view illustrating a portion of an image sensor according to some embodiments of the inventive concept. FIG. 13 is a cross-sectional view taken along a line II-II' of FIG. 12 and further illustrates an image sensor according to some embodiments of the inventive concept.

Referring to FIGS. 12 and 13, the pixel array region R1 (see FIG. 2) may include the central region CR and the edge region ER surrounding the central region CR, as described above with reference to FIG. 2.

The semiconductor pattern 141 may vertically extend from the first surface 100a to the second surface 100b of the semiconductor substrate 100, as described above. The semiconductor pattern 141 may include first portions extending in the first direction D1 and second portions extending in the second direction D2, when viewed in a plan view.

The semiconductor pattern 141 may include a first semiconductor pattern 141a provided in the central region CR of the pixel array region R1 (see FIG. 2) and a second semiconductor pattern 141b provided in the edge region ER of the pixel array region R1 (see FIG. 2). The first and second semiconductor patterns 141a and 141b may include N-type or P-type dopants. Here, a dopant concentration in the first semiconductor pattern 141a may be different than a dopant concentration in the second semiconductor pattern 141b. For example, the dopant concentration in the first semiconductor pattern 141a may be greater than the dopant concentration in the second semiconductor pattern 141b.

First and second contact plugs CP1 and CP2 may be disposed in the interlayer insulating layers 211, 213 and 215. The first contact plugs CP1 may be connected to the floating diffusion regions FD, the source/drain dopant regions, and/or the reset, amplifying and selection gate electrodes RG, AG and SG. The second contact plug CP2 may be connected to the second semiconductor pattern 141b in the pad region R2 (see FIG. 2) around the pixel array region R1 (see FIG. 2).

A negative bias may be applied to the second semiconductor pattern 141b through a conductive line and the second contact plugs CP2 in the pad region R2 of FIG. 2, and a predetermined bias may be transmitted from the pad region R2 of FIG. 2 to the central region CR of the pixel array region R1 of FIG. 2.

According to the embodiments illustrated in FIGS. 12 and 13, since the dopant concentration in the first semiconductor pattern 141a is greater than the dopant concentration in the second semiconductor pattern 141b, it is possible to improve a speed at which the bias applied to the second semiconductor pattern 141b is transmitted to the first semiconductor pattern 141a of the central region CR.

FIGS. 14, 15, 16, 17, 18A, 18B, 19A, 19B, 20, 21 and 22 (hereafter collectively referred to as, "FIGS. 14 to 22") are respective cross-sectional views taken along the line I-I' of FIG. 4 and further illustrate a method of manufacturing an image sensor according to some embodiments of the inventive concept.

Figure 14:
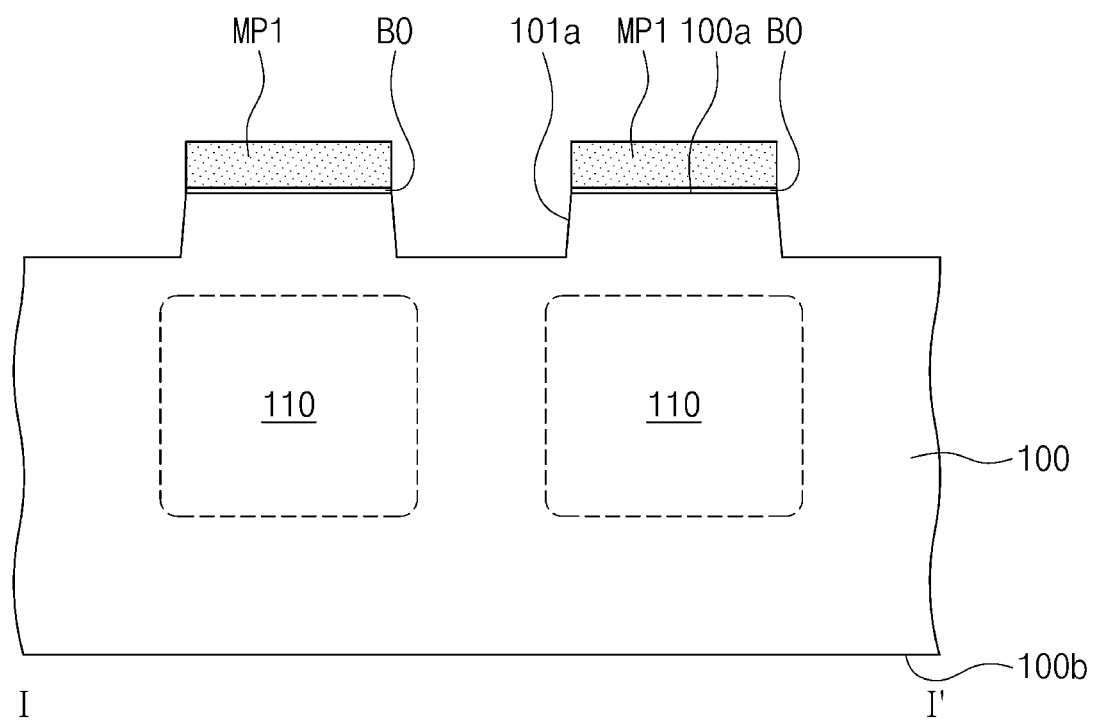
FIGS. 14, 15, 16, 17, 18A, 18B, 19A, 19B, 20, 21 and 22 are respective cross-sectional views taken along the line I-I' of FIG. 4 illustrating a method of manufacturing an image sensor according to some embodiments of the inventive concept.

Referring to FIGS. 4 and 14, a semiconductor substrate 100 having a first conductivity type (e.g., a P-type) may be provided. The semiconductor substrate 100 may have a first surface 100a and an opposing second surface 100b. The semiconductor substrate 100 may be a substrate in which an epitaxial layer having the first conductivity type is formed on a bulk silicon substrate having the first conductivity type. Alternatively, the semiconductor substrate 100 may be a bulk semiconductor substrate including a well having the first conductivity type.

Photoelectric conversion regions 110 may be formed in the semiconductor substrate 100. The formation of the photoelectric conversion regions 110 may include forming a mask pattern (not shown) having openings respectively corresponding to the first and second pixel regions PR1 and PR2 on the first surface 100a of the semiconductor substrate 100, and injecting dopants of second conductivity type (e.g., an N-type) different than the first conductivity type into the semiconductor substrate 100 by using the mask pattern. The mask pattern may be removed after the formation of the photoelectric conversion regions 110.

In each of the first and second pixel regions PR1 and PR2, the first surface 100a of the semiconductor substrate 100 may be patterned to form a first trench 101a. The first trench 101a may define first and second active portions ACT1 and ACT2 in each of the first and second pixel regions PR1 and PR2. A buffer oxide layer BO and a first mask pattern MP1 may be sequentially formed on the first surface 100a of the semiconductor substrate 100, and the semiconductor substrate 100 may be anisotropically etched using the first mask pattern MP1 as an etch mask to form the first trench 101a. For example, the first mask pattern MP1 may include silicon nitride or silicon oxynitride. A bottom surface of the first trench 101a may be spaced apart from the photoelectric conversion regions 110. In some embodiments, the first trench 101a may be formed before or after the formation of the photoelectric conversion regions 110.

Figure 15:
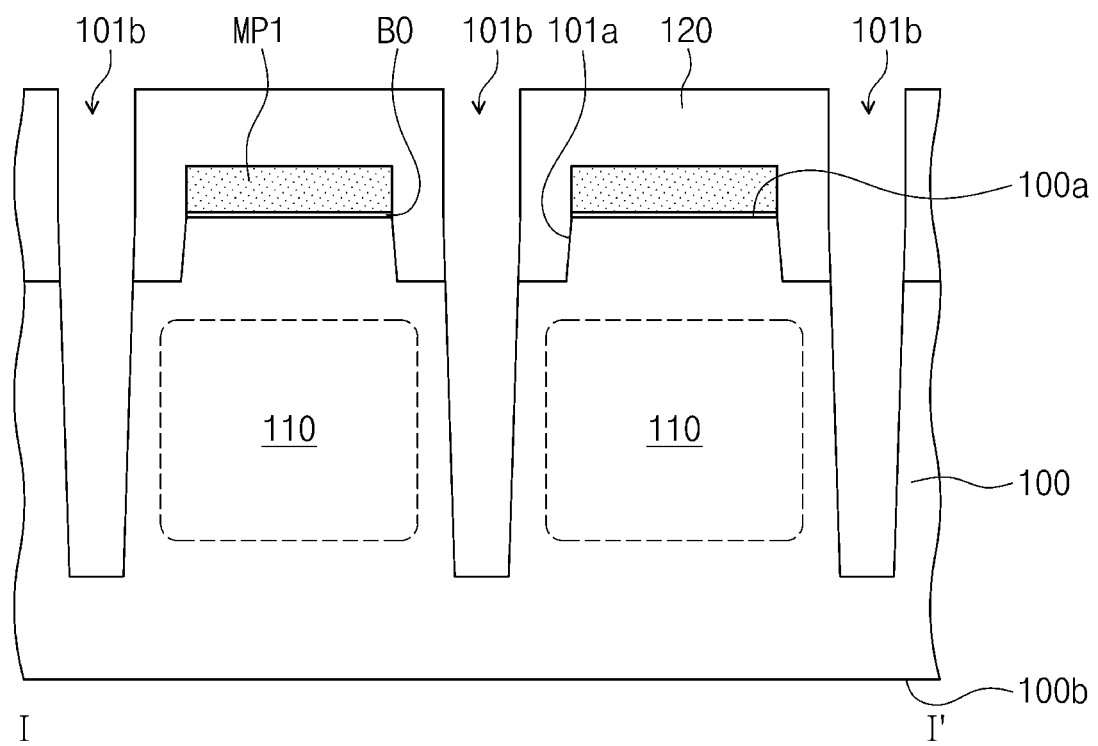

Referring to FIGS. 4 and 15, a filling insulation layer 120 may be formed to fill the first trench 101a. The filling insulation layer 120 may be formed by thickly depositing an insulating material on the semiconductor substrate 100 having the first trench 101a. The filling insulation layer 120 may fill the first trench 101a and may cover the first mask pattern MP1.

Next, a second trench 101b may be formed to define the pixel regions PR1 and PR2. The second trench 101b may be formed by patterning the filling insulation layer 120 and the first surface 100a of the semiconductor substrate 100. The first and second pixel regions PR1 and PR2 may be arranged in a matrix form along the first and second directions D1 and D2 intersecting each other.

For example, a second mask pattern (not shown) may be formed on the filling insulation layer 120, and the filling insulation layer 120 and the semiconductor substrate 100 may be anisotropically etched using the second mask pattern as an etch mask to form the second trench 101b.

The second trench 101b may vertically extend from the first surface 100a toward the second surface 100b of the semiconductor substrate 100 and may expose an inner sidewall of the semiconductor substrate 100. The second trench 101b may be deeper than the first trench 101a and may penetrate a portion of the first trench 101a. The second trench 101b may be formed to surround each of the photoelectric conversion regions 110 in a plan view. That is, the second trench 101b may include a plurality of first regions extending in the first direction D1 and having uniform widths and a plurality of second regions extending in the second direction D2 and having uniform widths, when viewed in a plan view.

The second trench 101b may be formed by performing the anisotropic etching process, and thus the width of the second trench 101b may become progressively more narrow from the first surface 100a toward the second surface 100b of the semiconductor substrate 100. That is, the second trench 101b may have an inclined sidewall. A bottom surface of the second trench 101b may be spaced apart from the second surface 100b of the semiconductor substrate 100.

The sidewall of the second trench 101b may be damaged by the etching process performed on the semiconductor substrate 100, and thus surface defects (e.g., crystal defects and/or dangling bonds) may occur at the sidewall of the second trench 101b.

Figure 16:
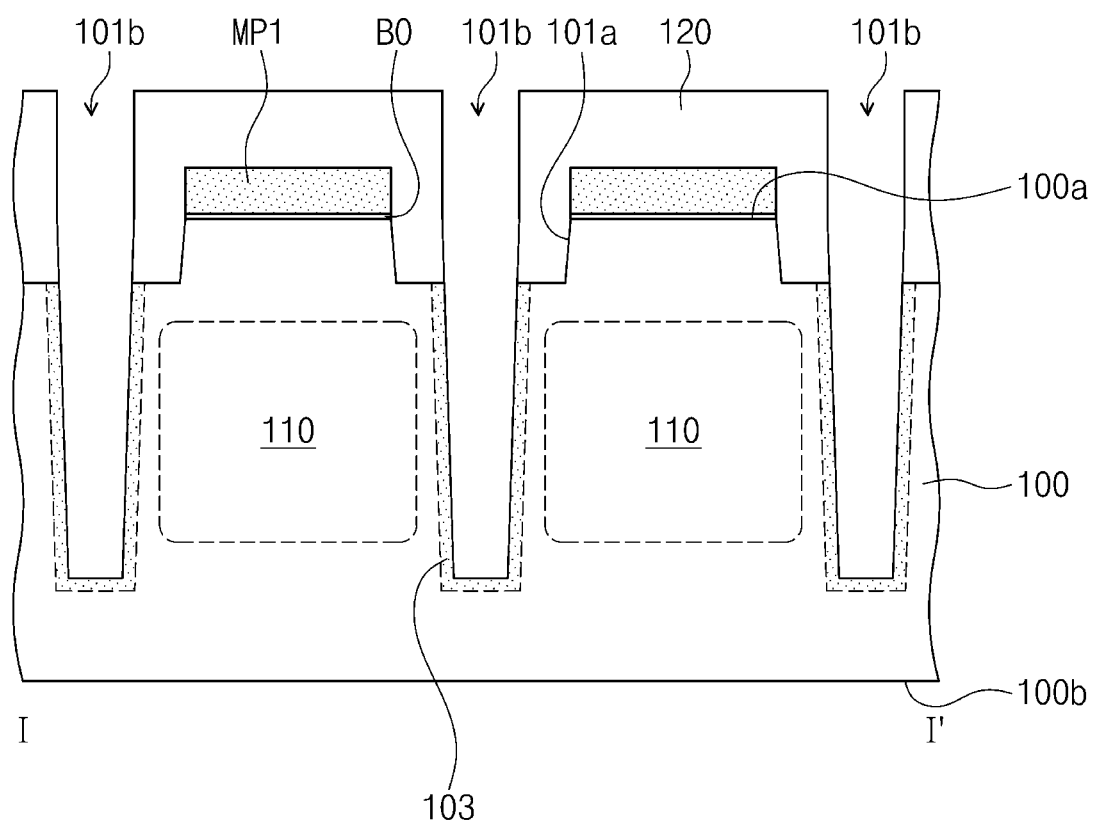

Referring to FIGS. 4 and 16, a barrier region 103 including dopants of the first conductivity type may be formed along an inner surface of the second trench 101b. For example, the barrier region 103 may include P-type dopants. The barrier region 103 may be formed by implanting dopants of the first conductivity type into the semiconductor substrate 100 through the inner surface of the second trench 101b. Alternatively, a sacrificial layer (not shown) including the dopants of the first conductivity type may be formed in the second trench 101b, and the dopants in the sacrificial layer may be diffused into the semiconductor substrate 100 by a thermal treatment process, thereby forming the barrier region 103. In this case, the sacrificial layer may be removed after the formation of the barrier region 103.

Figure 17:
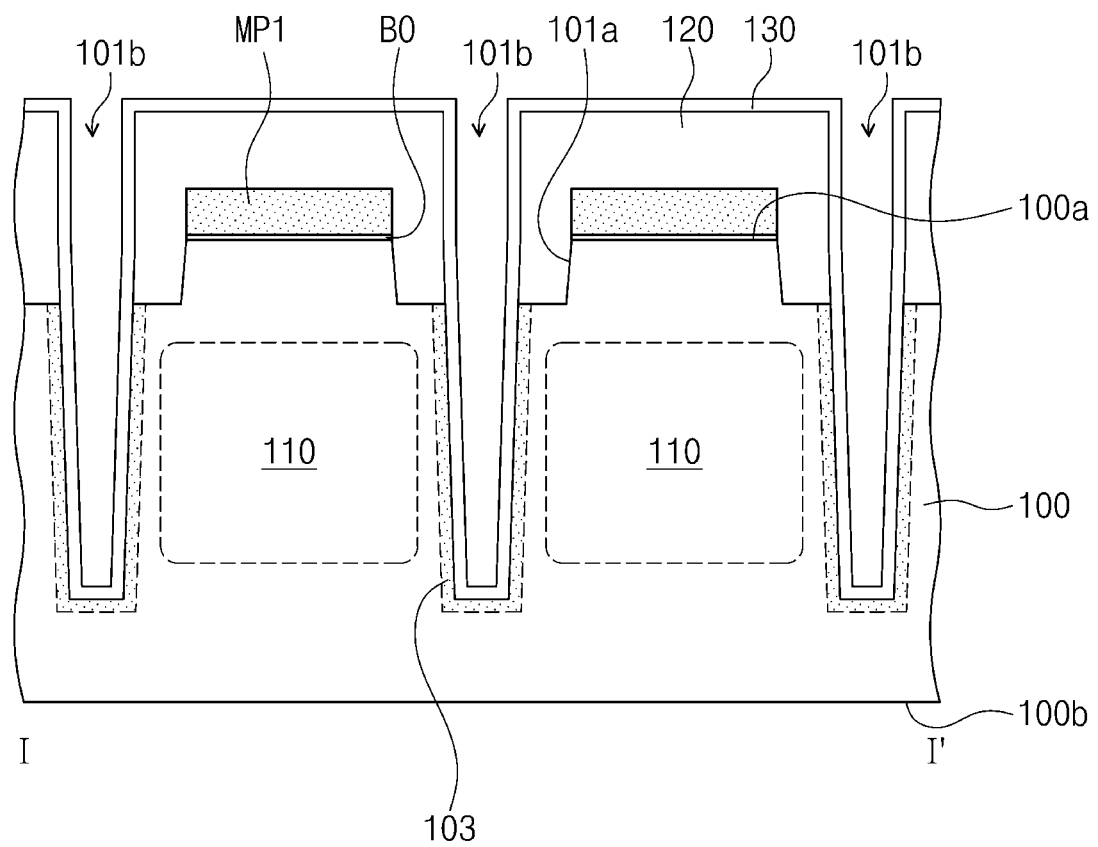

Referring to FIGS. 4 and 17, a sidewall insulating layer 130 may be formed to conformally cover the inner surface of the second trench 101b. The sidewall insulating layer 130 may be formed by depositing an insulating material with a substantially uniform thickness on an entire top surface of the semiconductor substrate 100 having the second trench 101b. That is, the sidewall insulating layer 130 may extend from the inner surface of the second trench 101b onto a top surface of the filling insulation layer 120. For example, the sidewall insulating layer 130 may include at least one of silicon oxide, silicon nitride, or silicon oxynitride.

Figure 18A:
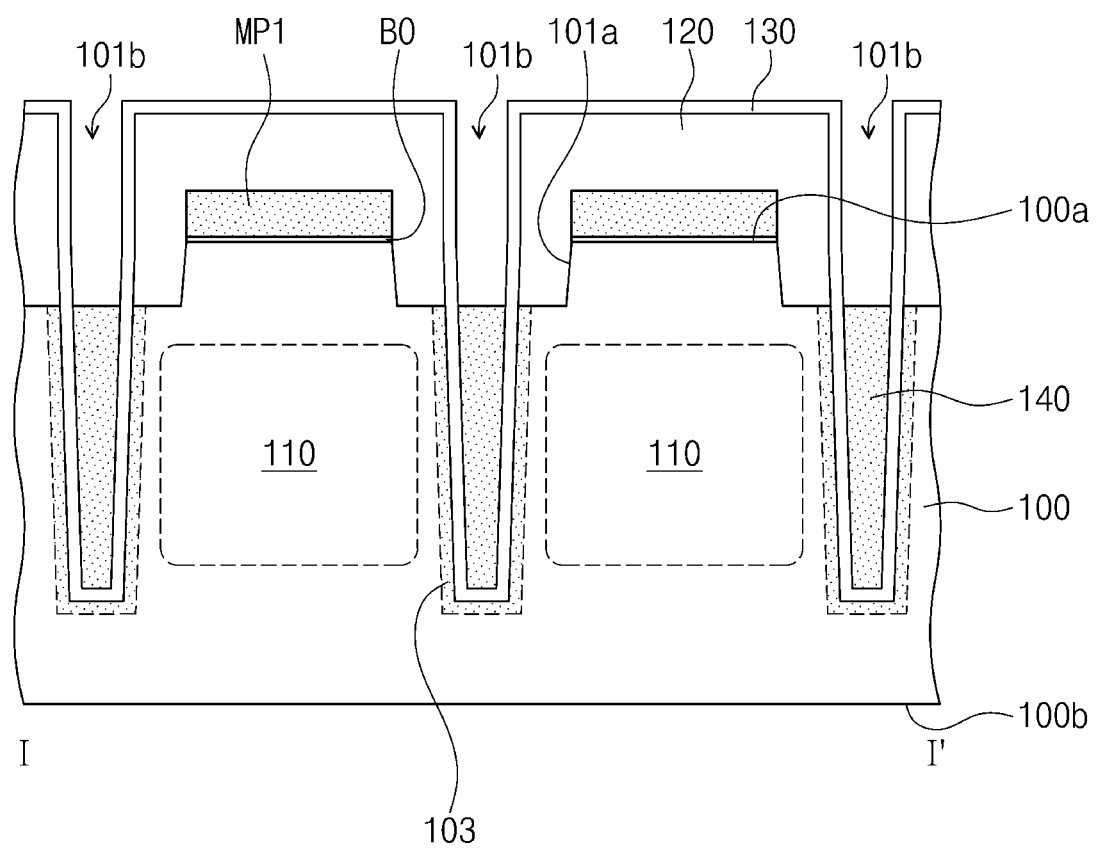
Figure 18B:
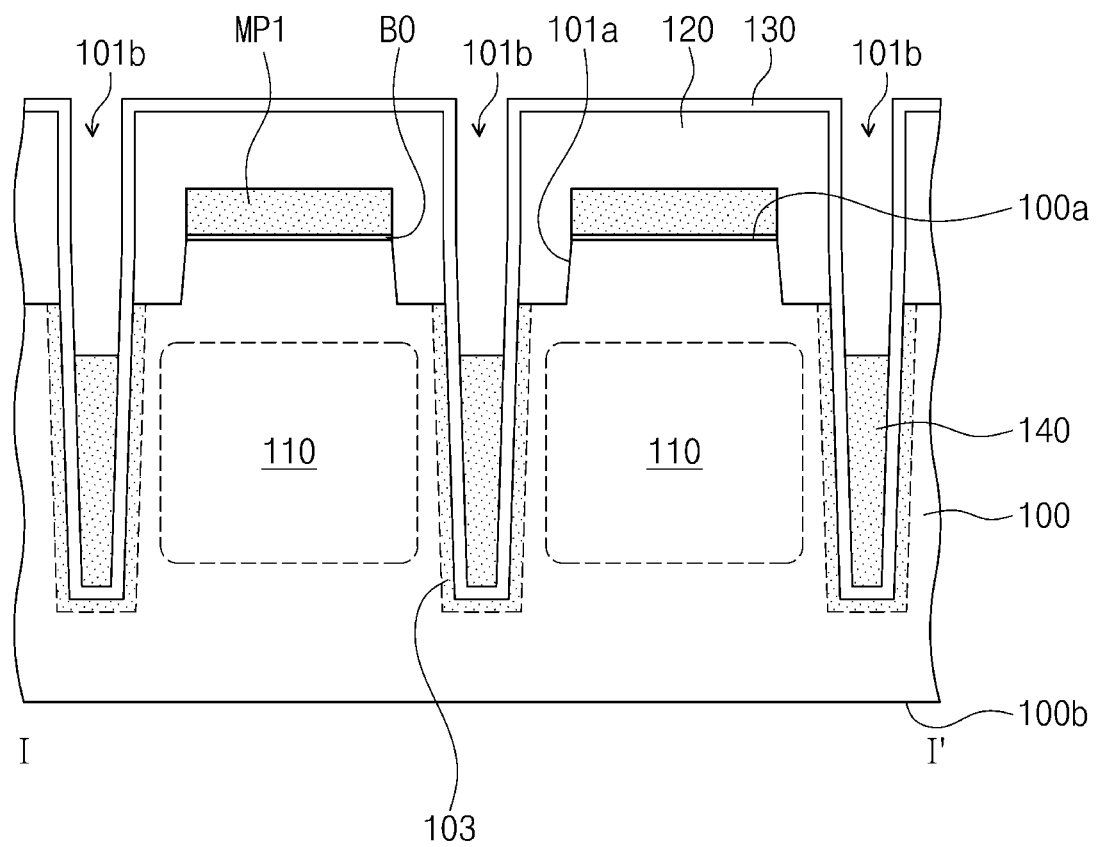

Referring to FIGS. 4, 18A and 18B, a semiconductor pattern 140 may be formed in the second trench 101b having the sidewall insulating layer 130. For example, a semiconductor layer may be deposited to fill the second trench 101b having the sidewall insulating layer 130, and then, the semiconductor pattern 140 may be formed by removing the semiconductor layer from the top surface of the filling insulation layer 120 and an upper region of the second trench 101b. Here, the semiconductor layer may be an undoped poly-silicon layer.

A top surface of the semiconductor pattern 140 may be located at the same level as or a higher level than a bottom surface of the first trench 101a. That is, the semiconductor pattern 140 may fill a lower region of the second trench 101b, which is adjacent to the barrier region 103.

Alternatively, according to an embodiment of FIG. 18B, the top surface of the semiconductor pattern 140 may be located at a lower level than the bottom surface of the first trench 101a.

Figure 19A:
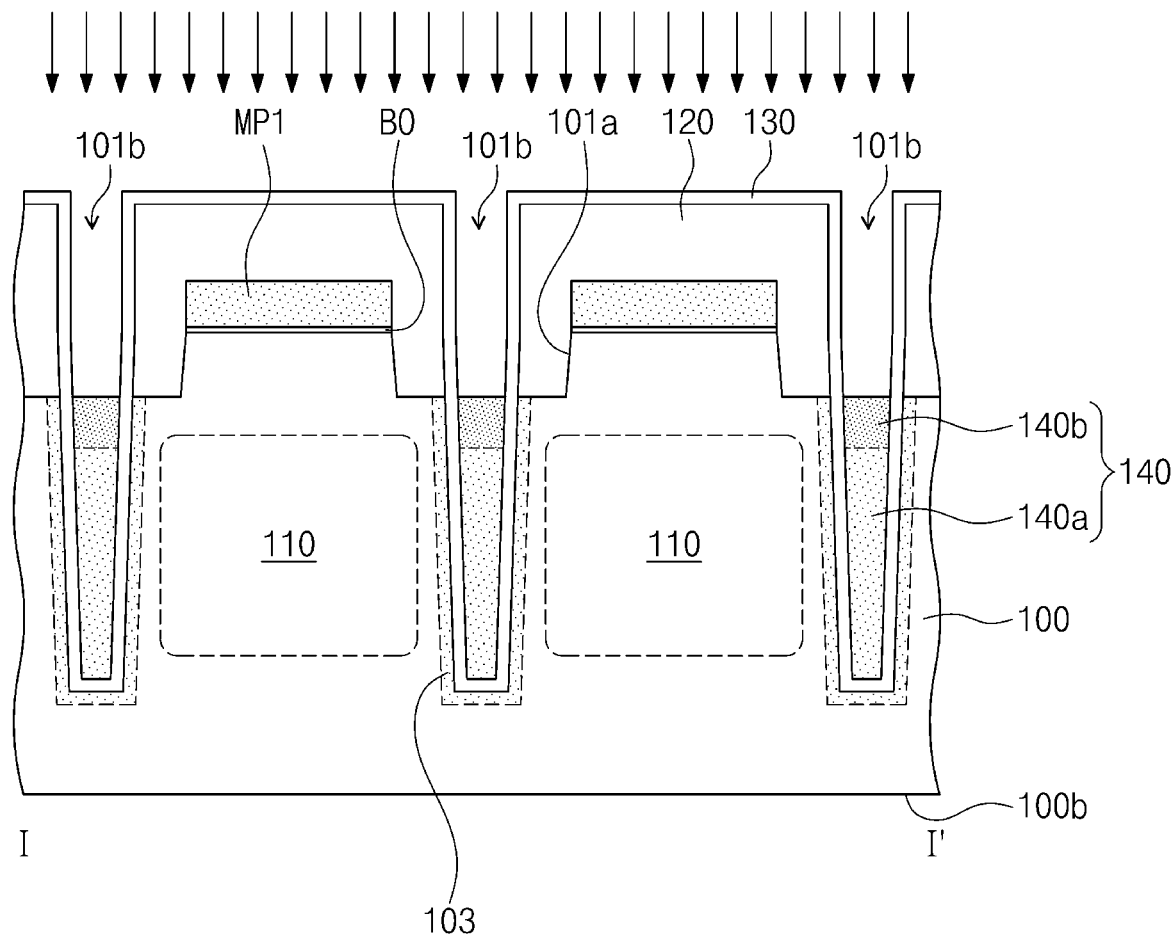

Referring to FIGS. 4, 18A and 19A, dopants may be implanted into an upper region of the semiconductor pattern 140 by an ion implantation process. Thus, the semiconductor pattern 140 may include an upper dopant region 140b doped with the dopants at a high concentration, and a lower region 140a not doped with dopants. The dopants in the semiconductor pattern 140 may be N-type or P-type dopants. For example, dopants such as boron (B), phosphorus (P), arsenic (As), gallium (Ga), indium (In), antimony (Sb), or aluminum (Al) may be ion-implanted into the semiconductor pattern 140.

A depth of the upper dopant region 140b from the first surface 100a of the semiconductor substrate 100 may be changed depending on an ion implantation energy in the ion implantation process.

Since the upper dopant region 140b is formed by the ion implantation process, an interface may not be formed between the upper dopant region 140b and the lower region 140a in the semiconductor pattern 140.

Figure 19B:
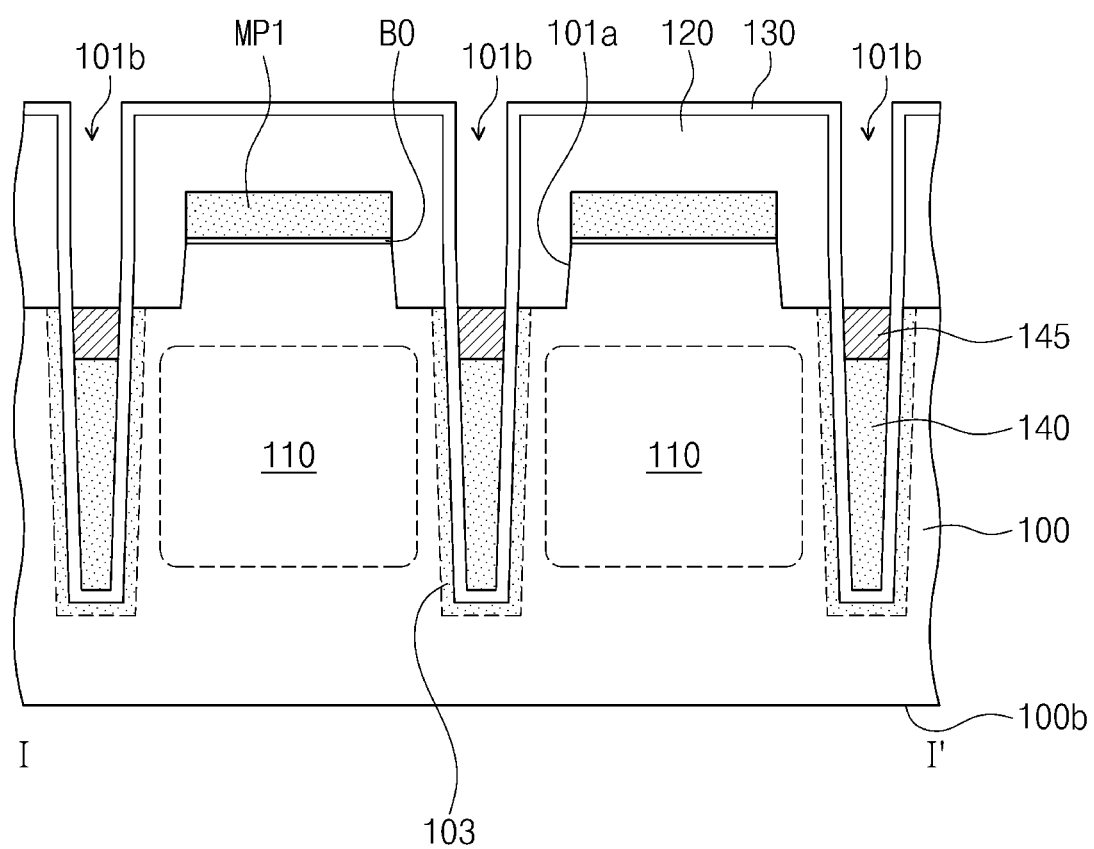

In certain embodiments, referring to FIGS. 18B and 19B, an upper semiconductor pattern 145 may be formed on the top surface of the semiconductor pattern 140. A poly-silicon layer doped with dopants may be deposited in the second trench 101b having the semiconductor pattern 140, and then, the poly-silicon layer doped with dopants may be removed from the top surface of the filling insulation layer 120 and an upper region of the second trench 101b, thereby forming the upper semiconductor pattern 145. Since the upper semiconductor pattern 145 is formed using an additional deposition process, an interface may be formed between the upper semiconductor pattern 145 and the semiconductor pattern 140.

Figure 20:
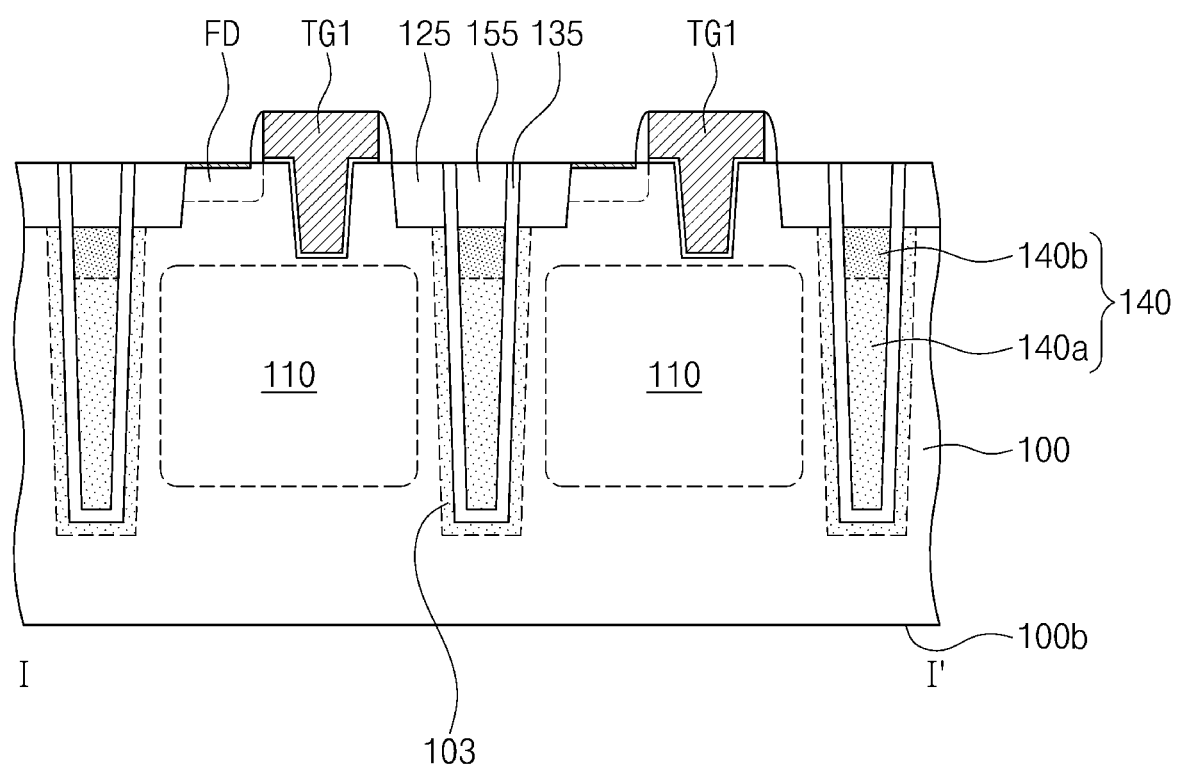

Referring to FIGS. 19A and 20, a filling insulation pattern 155 may be formed on the semiconductor pattern 140 after the upper dopant region 140b doped with the dopants is formed in the semiconductor pattern 140. In certain embodiments, when the upper semiconductor pattern 145 is formed in the second trench 101b, the filling insulation pattern 155 may be formed on the upper semiconductor pattern 145.

The formation of the filling insulation pattern 155 may include depositing an insulating layer completely filling the second trench 101b having the semiconductor pattern 140 or the upper semiconductor pattern 145, and planarizing the insulating layer, the sidewall insulating layer 130 and the filling insulation layer 120 to expose a top surface of the first mask pattern MP1. When the filling insulation pattern 155 is formed, a device isolation layer 125 may be formed in the first trench 101a and a sidewall insulating pattern 135 may be formed between the device isolation layer 125 and the filling insulation pattern 155.

After the formation of the filling insulation pattern 155 and the device isolation layer 125, the first mask pattern MP1 and the buffer oxide layer BO may be removed from the first surface 100a of the semiconductor substrate 100.

Next, MOS transistors constituting readout circuits may be formed on the first surface 100a of the semiconductor substrate 100.

As described above, the first transfer gate electrodes TG1 may be formed on the first active portions ACT1 of the first pixel regions PR1, respectively, and the second transfer gate electrodes TG2 may be formed on the first active portions ACT1 of the second pixel regions PR2, respectively. The formation of the first and second transfer gate electrodes TG1 and TG2 may include patterning the semiconductor substrate 100 to form a gate recess region in each of the first and second pixel regions PR1 and PR2, forming a gate insulating layer conformally covering an inner surface of the gate recess region, forming a gate conductive layer filling the gate recess region, and patterning the gate conductive layer. In addition, when the gate conductive layer is patterned to form the first and second transfer gate electrodes TG1 and TG2, gate electrodes of readout transistors (or logic transistors) may also be formed on the second active portions ACT2 of the first and second pixel regions PR1 and PR2.

After the formation of the first and second transfer gate electrodes TG1 and TG2, a floating diffusion region FD may be formed in the semiconductor substrate 100 (i.e., the first active portion ACT1) at a side of each of the first and second transfer gate electrodes TG1 and TG2. The floating diffusion regions FD may be formed by ion-implanting dopants of the second conductivity type. In addition, when the floating diffusion regions FD are formed, source/drain dopant regions of the readout transistors may be formed in the second active portions ACT2.

Figure 21:
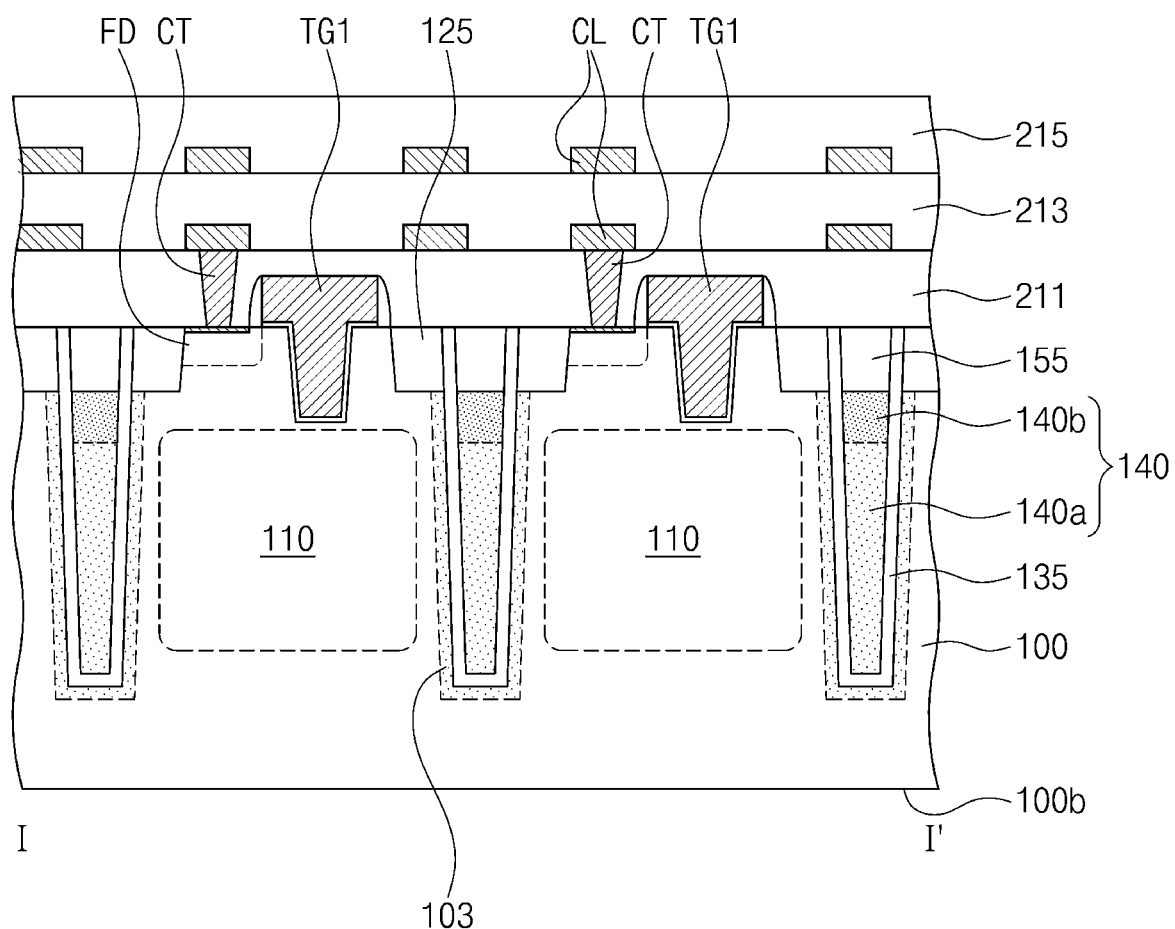

Referring to FIG. 21, interlayer insulating layers 211, 213 and 215, contact plugs CT and connection lines CL may be formed on the first surface 100a of the semiconductor substrate 100.

The interlayer insulating layers 211, 213 and 215 may cover the first and second transfer transistors and the readout transistors. The interlayer insulating layers 211, 213 and 215 may be formed of an insulating material having an excellent gap-fill characteristic and may be formed to have planarized top surfaces. For example, the interlayer insulating layers 211, 213 and 215 may be formed of a high density plasma (HDP) oxide, Tonen silazene (TOSZ), spin-on-glass (SOG), and/or undoped silica glass (USG).

The contact plugs CT connected to the floating diffusion regions FD and/or the readout transistors may be formed in the interlayer insulating layers 211, 213 and 215. The connection lines CL may be formed between the interlayer insulating layers 211, 213 and 215. The connection lines for electrical connection of the readout transistors may be disposed without location limitation. The contact plugs CT and the connection lines CL may be formed of at least one of copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or an alloy of a combination thereof.

Figure 22:
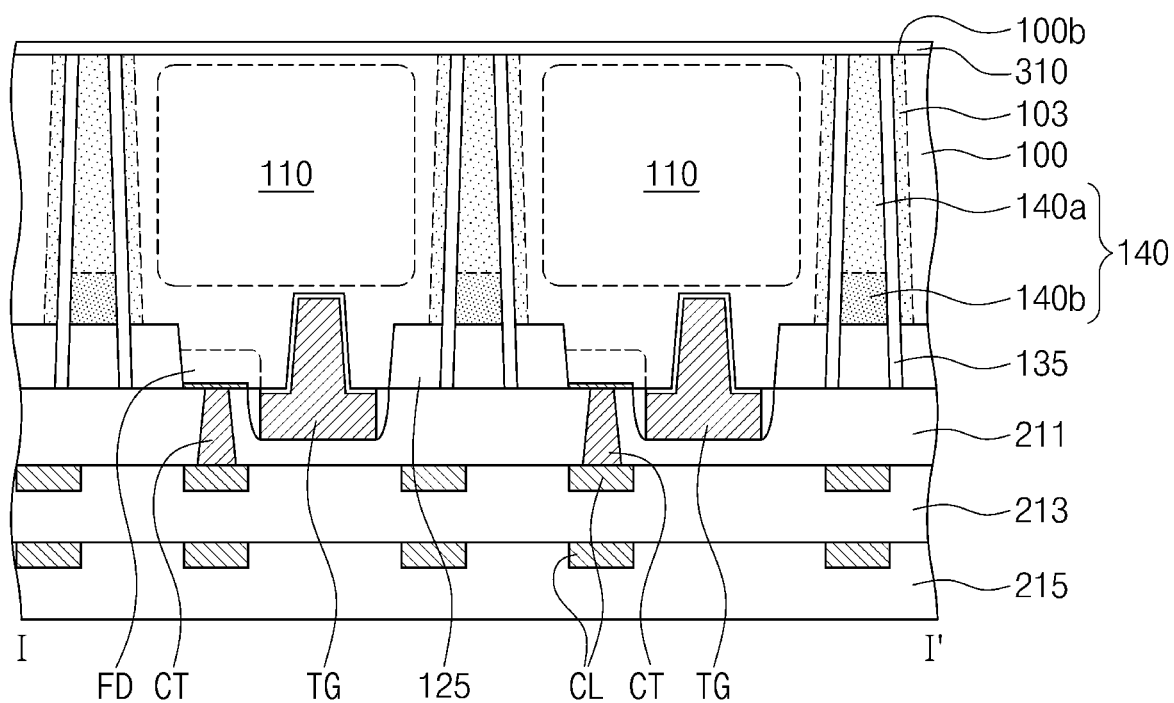

Referring to FIGS. 4 and 22, a thinning process for removing a substantial portion of the thickness of the semiconductor substrate 100 may be performed. The thinning process may include grinding and/or polishing of the second surface 100b of the semiconductor substrate 100, as well as (or alternately) anisotropically and/or isotropically etching the ground or polished second surface 100b of the semiconductor substrate 100. The semiconductor substrate 100 may be turned over to thin the semiconductor substrate 100. A portion of the semiconductor substrate 100 may be removed by the grinding/polishing process(es), and/or the anisotropic/isotropic etching process(es) to remove any remaining surface defects of the semiconductor substrate 100.

The semiconductor pattern 140 may be exposed at the second surface 100b of the semiconductor substrate 100 by the thinning process performed on the semiconductor substrate 100. In addition, a portion of the sidewall insulating layer 130 on the bottom surface of the second trench 101b may be removed by the thinning process of the semiconductor substrate 100 to form the sidewall insulating pattern 135. A surface of the semiconductor pattern 140 and a surface of the sidewall insulating pattern 135 may be located at substantially the same level as the second surface 100b of the semiconductor substrate 100.

Next, a buffer insulating layer 310 may be formed on the second surface 100b of the semiconductor substrate 100. The buffer insulating layer 310 may cover the second surface 100b of the semiconductor substrate 100 and the surface of the semiconductor pattern 140. The buffer insulating layer 310 may be formed by depositing a metal oxide such as aluminum oxide and/or hafnium oxide.

Referring again to FIGS. 4 and 5, a grid pattern 315 may be formed on the buffer insulating layer 310. A metal layer may be deposited, and then, the deposited metal layer may be patterned to form the grid pattern 315. The grid pattern 315 may extend in the first direction D1 and the second direction D2 and may have a grid shape. The grid pattern 315 may overlap with the semiconductor pattern 140 when viewed in a plan view.

Subsequently, color filters 320 respectively corresponding to the first and second pixel regions PR1 and PR2 may be formed on the buffer insulating layer 310. The color filters 320 may include blue, red and green color filters. Next, micro lenses 330 may be formed on the color filters 320, respectively.

According to the embodiments of the inventive concept, contact plugs provided in the pad region around the pixel array region may be connected to the high-concentration dopant region of the semiconductor pattern in the pixel isolation structure. Thus, when a predetermined voltage is applied to the contact plugs in the pad region around the pixel array region, delay of a signal transmitted from the pad region to the central region may be reduced. As a result, it is possible to reduce a dark current which may be caused by defects of an interface between the semiconductor substrate and the pixel isolation structure. In addition, it is possible to reduce a difference in dark current characteristic between the edge region and the central region of the pixel array region. Thus, electrical and/or optical performance characteristics of the image sensor may be improved.

While the inventive concept have been described with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. An image sensor comprising:
a semiconductor substrate of first conductivity type having a first surface and a second surface opposing the first surface, and including pixel regions;
photoelectric conversion regions of second conductivity type respectively provided in the pixel regions; and
a pixel isolation structure disposed in the semiconductor substrate to define the pixel regions, extending from the first surface to the second surface, and surrounding each of the photoelectric conversion regions,
wherein the pixel isolation structure comprises
a semiconductor pattern penetrating the semiconductor substrate between the first surface to the second surface,
a sidewall insulating pattern between a sidewall of the semiconductor pattern and the semiconductor substrate,
a dopant region formed in at least a portion of the semiconductor pattern, and
a filling insulation pattern disposed on the semiconductor pattern and having a top surface located at substantially a same level as the first surface of the semiconductor substrate.

2. The image sensor of claim 1, further comprising:
a device isolation layer disposed in the semiconductor substrate to define an active portion in each of the pixel regions,
wherein the dopant region of the pixel isolation structure is spaced apart from the first and second surfaces of the semiconductor substrate and is adjacent to the device isolation layer.

3. The image sensor of claim 2, further comprising:
a transfer gate electrode disposed on the active portion of the semiconductor substrate in each of the pixel regions.

4. The image sensor of claim 1, wherein the semiconductor substrate comprises a pixel array region in which the pixel regions are provided, and a pad region around the pixel array region, and
the image sensor further comprises a contact plug connected to the dopant region of the semiconductor pattern in the pad region, and a conductive line connected to the contact plug and configured to receive a bias.

5. The image sensor of claim 1, wherein the semiconductor pattern comprises first portions extending in a first direction and spaced apart from each other in a second direction intersecting the first direction, and second portions extending in the second direction and spaced apart from each other in the first direction, and
each of the photoelectric conversion regions is disposed between a pair of the first portions and between a pair of the second portions when viewed in a plan view.

6. The image sensor of claim 1, further comprising:
a barrier region including dopants of the first conductivity type disposed in the semiconductor substrate to cover a sidewall of the sidewall insulating pattern.

7. The image sensor of claim 1, wherein a concentration of dopants in the semiconductor pattern becomes less in a direction extending from the first surface towards the second surface.

8. The image sensor of claim 1, wherein the dopant region is adjacent to the filling insulation pattern.

9. An image sensor comprising:
a semiconductor substrate of first conductivity type having a first surface and a second surface opposing the first surface;
photoelectric conversion regions of second conductivity type, two-dimensionally arranged in the semiconductor substrate; and
a pixel isolation structure extending from the first surface to the second surface and surrounding each of the photoelectric conversion regions, wherein the pixel isolation structure comprises
  a semiconductor pattern vertically penetrating the semiconductor substrate, and
  a sidewall insulating pattern surrounding a sidewall of the semiconductor pattern,
  wherein the semiconductor pattern includes an upper region adjacent to the first surface and a lower region adjacent to the second surface,
  a dopant concentration of the upper region is greater than a dopant concentration of the lower region, and
  the upper region is formed of doped poly-silicon and the lower region is formed of undoped poly-silicon.

10. The image sensor of claim 9, wherein the semiconductor pattern comprises:
a top surface spaced apart from the first surface; and
a bottom surface disposed at a same level as the second surface.

11. The image sensor of claim 9, further comprising:
a contact plug connected to the upper region; and
a conductive line connected to the contact plug.

12. The image sensor of claim 9, further comprising:
a readout circuit layer disposed on the first surface and electrically connected to the photoelectric conversion regions; and
a micro lens array disposed on the second surface and including a plurality of micro lenses.

13. The image sensor of claim 9, wherein a width of the semiconductor pattern becomes progressively more narrow in a direction extending from the first surface to the second surface.

14. The image sensor of claim 9, further comprising a barrier region including dopants of the first conductivity type disposed in the semiconductor substrate to cover a sidewall of the sidewall insulating pattern.

15. The image sensor of claim 9, further comprising a metal grid pattern on the second surface of the semiconductor substrate and overlapping the semiconductor pattern.

16. An image sensor comprising:
a semiconductor substrate of first conductivity type having a first surface and a second surface opposing the first surface;
photoelectric conversion regions of second conductivity type, two-dimensionally arranged in the semiconductor substrate;
a pixel isolation structure extending from the first surface to the second surface and surrounding each of the photoelectric conversion regions,
wherein the pixel isolation structure comprises
  a semiconductor pattern vertically penetrating the semiconductor substrate, and
  a sidewall insulating pattern surrounding a sidewall of the semiconductor pattern,
  wherein the semiconductor pattern includes an upper region adjacent to the first surface and a lower region adjacent to the second surface, and
  a dopant concentration of the upper region is greater than a dopant concentration of the lower region;
a device isolation layer adjacent to the first surface and disposed in the semiconductor substrate to define an active portion; and
a filling insulation pattern disposed on the semiconductor pattern and having a top surface disposed substantially at a same level as a top surface of the device isolation layer,
wherein the upper region of the semiconductor pattern is adjacent to the filling insulation pattern.

17. The image sensor of claim 16, wherein a width of the semiconductor pattern becomes progressively more narrow in a direction extending from the first surface to the second surface.

18. The image sensor of claim 16, further comprising a barrier region including dopants of the first conductivity type disposed in the semiconductor substrate to cover a sidewall of the sidewall insulating pattern.

19. The image sensor of claim 16, further comprising a metal grid pattern on the second surface of the semiconductor substrate and overlapping the semiconductor pattern.

20. The image sensor of claim 16, wherein the filling insulation pattern has a bottom surface that extends below a level of a bottom surface of the device isolation layer.

* * * * *